(12) United States Patent
Tong et al.

(10) Patent No.: US 12,182,355 B2
(45) Date of Patent: Dec. 31, 2024

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Kemeng Tong, Beijing (CN); Cong Fan, Beijing (CN); Fan He, Beijing (CN); Xiangdan Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/022,297

(22) PCT Filed: May 27, 2022

(86) PCT No.: PCT/CN2022/095716
§ 371 (c)(1),
(2) Date: Feb. 21, 2023

(87) PCT Pub. No.: WO2023/226024
PCT Pub. Date: Nov. 30, 2023

(65) Prior Publication Data
US 2024/0281088 A1 Aug. 22, 2024

(51) Int. Cl.
*G06F 3/041* (2006.01)
*G06F 3/044* (2006.01)
*H10K 59/40* (2023.01)

(52) U.S. Cl.
CPC ........ *G06F 3/04164* (2019.05); *G06F 3/0412* (2013.01); *G06F 3/0443* (2019.05);
(Continued)

(58) Field of Classification Search
CPC ....... G06F 3/04164; G06F 2203/04112; G06F 3/0446
See application file for complete search history.

(56) References Cited

U.S. PATENT DOCUMENTS 10,928,959 B2   2/2021   Xu et al.
11,347,343 B2   5/2022   Yan et al.
(Continued)

FOREIGN PATENT DOCUMENTS

CN   104375692 A   2/2015
CN   106462304 A   2/2017
(Continued)

OTHER PUBLICATIONS

Written Opinion from PCT/CN2022/095716 dated Sep. 14, 2022.

*Primary Examiner* — Van N Chow
(74) *Attorney, Agent, or Firm* — Calfee, Halter & Griswold LLP

(57) ABSTRACT

A display panel, including a display region and a peripheral region arranged around the display region, where the display panel includes: a base substrate; and a grid-shaped conductive part, arranged on a side of the base substrate and located in the display region; the grid-shaped conductive part includes: a touch detection electrode; and a touch detection lead wire, arranged on a side of the touch detection electrode close to the peripheral region, and at least partially located in the display region; wherein a first gap is provided between an orthographic projection of the touch detection lead wire on the base substrate and an orthographic projection of the touch detection electrode on the base substrate, and an outline of the first gap comprises at least two first curves connected in sequence.

20 Claims, 14 Drawing Sheets

(52) U.S. Cl.
CPC ........... *G06F 3/0446* (2019.05); *H10K 59/40* (2023.02); *G06F 2203/04107* (2013.01); *G06F 2203/04111* (2013.01); *G06F 2203/04112* (2013.01)

(56) References Cited

U.S. PATENT DOCUMENTS

| | | | | |
|---|---|---|---|---|
| 2011/0234545 | A1* | 9/2011 | Tanaka | G06F 3/0436 345/177 |
| 2014/0041999 | A1 | 2/2014 | Yim et al. | |
| 2014/0049485 | A1 | 2/2014 | Oh et al. | |
| 2014/0253829 | A1 | 9/2014 | Kim et al. | |
| 2017/0308192 | A1* | 10/2017 | Ogura | G06F 3/04164 |
| 2020/0192506 | A1 | 6/2020 | Ogura | |
| 2020/0285330 | A1 | 9/2020 | Xu et al. | |
| 2021/0004112 | A1* | 1/2021 | Miyamoto | G06F 3/0443 |
| 2021/0181888 | A1 | 6/2021 | Yan et al. | |

FOREIGN PATENT DOCUMENTS

| | | |
|---|---|---|
| CN | 106537304 A | 3/2017 |
| CN | 106775066 A | 5/2017 |
| CN | 107037909 A | 8/2017 |
| CN | 107132950 A | 9/2017 |
| CN | 108513653 A | 9/2018 |
| CN | 208488731 U | 2/2019 |
| CN | 109426395 A | 3/2019 |
| CN | 208888789 U | 5/2019 |
| CN | 110187797 A | 8/2019 |
| CN | 110244873 A | 9/2019 |
| CN | 110502151 A | 11/2019 |
| CN | 110688025 A | 1/2020 |
| CN | 110928434 A | 3/2020 |
| CN | 110968220 A | 4/2020 |
| CN | 112612371 A | 4/2020 |
| CN | 111506218 A | 8/2020 |
| CN | 111506221 A | 8/2020 |
| CN | 107132950 B | 10/2020 |
| CN | 213071139 U | 4/2021 |
| CN | 112187481 A | 5/2021 |
| CN | 113366419 A1 | 9/2021 |
| CN | 214122919 U | 9/2021 |
| CN | 114068622 A | 2/2022 |
| EP | 3564800 A1 | 11/2019 |
| JP | 2010198615 A | 9/2010 |
| JP | 2018060345 A | 4/2018 |
| JP | 6678553 B2 | 4/2020 |
| TW | 201445381 A | 12/2014 |
| WO | 2021203849 A1 | 10/2021 |

* cited by examiner

DISPLAY PANEL AND DISPLAY DEVICE

CROSS REFERENCE

The present disclosure is a National Stage of International Application No. PCT/CN2022/095716, filed on May 27, 2022, and the entire contents of which are incorporated herein by reference.

TECHNICAL FIELD

The present disclosure relates to the field of display technology, and in particular, to a display panel and a display device.

BACKGROUND

With the continuous improvement of consumers' pursuit of display screen sensory and the continuous advancement of display panel industry technology, in order to achieve a high screen proportion and achieve the ultimate viewing experience, the frame of the display panel is arranged to be narrow.

It should be noted that the information disclosed in the above background section is for enhancing the understanding of the background of the present disclosure, and therefore may include information that does not constitute the related art known to those of ordinary skill in the art.

SUMMARY

According to an aspect of the present disclosure, there is provided a display pane, including a display region and a peripheral region arranged around the display region, where the display panel includes:
  a base substrate;
  a grid-shaped conductive part, arranged on a side of the base substrate and located in the display region, where the grid-shaped conductive part includes:
  a touch detection electrode;
  a touch detection lead wire, arranged on a side of the touch detection electrode close to the peripheral region, and at least partially located in the display region; where a first gap is provided between an orthographic projection of the touch detection lead wire on the base substrate and an orthographic projection of the touch detection electrode on the base substrate, and an outline of the first gap includes at least two first curves connected in sequence.

In at least one embodiment of the present disclosure, the at least two first curves are provided with at least two different waveforms.

In at least one embodiment of the present disclosure, the first curves with at least two different waveforms are alternately connected to form the first gap.

In at least one embodiment of the present disclosure, the first gap includes more than one line opening, where the line opening disconnects more than one grid line of the grid-shaped conductive part to form the touch detection electrode and the touch detection lead wire, and inclination directions of the more than one the line opening are not on a same straight line.

In at least one embodiment of the present disclosure, a cross-connected part of at least two grid lines forms an intersection part, and an orthographic projection of the line opening on the base substrate and an orthographic projection of the intersection part of the grid line on the base substrate do not overlap with each other.

In at least one embodiment of the present disclosure, the touch detection lead wire includes:
  a first touch detection lead wire and/or the second touch detection lead wire; and
  a first shielding wire, adjacent to and arranged at intervals with the touch detection electrode, where the first gap is provided between the first shielding wire and the touch detection electrode, a second gap is provided between the first shielding wire and the first touch detection lead wire or the second touch detection lead wire, an outline of the second gap includes at least two second curves connected in sequence, and the at least two second curves are provided with at least two different waveforms.

In at least one embodiment of the present disclosure, the first gap and the second gap are parallel to each other.

In at least one embodiment of the present disclosure, the first touch detection lead wire is arranged adjacent to the second touch detection lead wire, and the touch detection lead wire further includes:
  a second shielding wire, arranged between the first touch detection lead wire and the second touch detection lead wire, where a third gap is provided both between the second shielding wire and the first touch detection lead wire and the second touch detection lead wire, an outline of the third gap includes at least two third curves connected in sequence, and the at least two third curves are provided with at least two different waveforms.

In at least one embodiment of the present disclosure, the second gap and the third gap are parallel to each other.

In at least one embodiment of the present disclosure, more than one first touch detection lead wire is provided, a fourth gap is provided between two adjacent first touch detection lead wires, an outline of the fourth gap includes at least two fourth curves connected in sequence, and the at least two fourth curves are provided with at least two different waveforms; more than one second touch detection lead wire is provided, a fifth gap is provided between two adjacent second touch detection lead wires, an outline of the fifth gap includes at least two fifth curves connected in sequence, and the at least two fifth curves are provided with at least two different waveforms; the fourth gap, the fifth gap and the third gap are parallel to each other.

In at least one embodiment of the present disclosure, the display panel further includes:
  a peripheral touch detection lead wire, arranged in the peripheral region, where a part of partial peripheral touch detection lead wire is arranged as a single-layer structure.

In at least one embodiment of the present disclosure, the peripheral touch detection lead wire includes:
  a first peripheral detection lead wire and/or a second peripheral detection lead wire, where the first peripheral detection lead wire is connected to the first touch detection lead wire, and the second peripheral detection lead wire is connected to the second touch detection lead wire;
  a third peripheral detection lead wire, connected to the touch detection electrode, where a part of the third peripheral detection lead wire is arranged as a single-layer structure; and a fourth peripheral detection lead wire, connected to the touch detection electrode, where a part of the fourth peripheral detection lead wire is arranged as a single-layer structure.

In at least one embodiment of the present disclosure, a difference between a sum of a resistance of the first peripheral detection lead wire and a resistance of the first touch detection lead wire and a resistance of the third peripheral detection lead wire is less than or equal to 10% of the resistance of the third peripheral detection lead wire, and the first peripheral detection lead wire and the third peripheral detection lead wire are connected to a same touch unit; and a difference between a sum of a resistance of the second peripheral detection lead wire and a resistance of the second touch detection lead wire and a resistance of the fourth peripheral detection lead wire is less than or equal to 10% of the resistance of the fourth peripheral detection lead wire, and the second peripheral detection lead wire and the fourth peripheral detection lead wire are connected to a same touch unit.

In at least one embodiment of the present disclosure, a length of the single-layer structure of the third peripheral detection lead wire decreases as a distance from the display region increases, and a length of the single layer structure of the fourth peripheral detection lead wire decreases as a distance from the display region increases.

In at least one embodiment of the present disclosure, a start position of the single-layer structure of the third peripheral detection lead wire is on a straight line with a start position of the first touch detection lead wire; the straight line is parallel to an edge of the display region close to a bonding region; the first peripheral detection lead wire and the third peripheral detection lead wire are connected to different touch electrodes of a same touch unit; the first touch detection lead wire is located on a side of the third peripheral detection lead wire close to the display region; a start position of the single-layer structure of the fourth peripheral detection lead wire is on a straight line with a start position of the second touch detection lead wire; the straight line is parallel to an edge of the display region close to the bonding region; the second peripheral detection lead wire and the fourth peripheral detection lead wire are connected to different touch electrodes of a same touch unit; and the second touch detection lead wire is located on a side of the fourth peripheral detection lead wire close to the display region.

In at least one embodiment of the present disclosure, a width of at least a part of the third peripheral detection lead wire is equal to or less than a width of the touch detection lead wire, and a width of at least a part of the fourth peripheral detection lead wire is equal to or less than a width of the touch detection lead wire.

In at least one embodiment of the present disclosure, the display panel includes a bending line located in the display region, a part of the display panel located on the bending line close to the peripheral region is bendable, and the touch detection lead wire is at least partially located on a side of the bending line close to the peripheral region.

In at least one embodiment of the present disclosure, the display panel further includes a bonding region located on a side of part of the peripheral region away from the display region, and the touch detection lead wire is located within a part of the peripheral region close to the display region.

In at least one embodiment of the present disclosure, a corner part of the display panel is provided with a rounded chamfer, two ends of the rounded chamfer are smoothly connected with a first edge line and a second edge line correspondingly, the first edge line extends along a first direction, the second edge line extends along a second direction, and the first direction intersects with the second direction; a non-zero distance is provided between the rounded chamfer and a first extension line of the first edge line, and a non-zero distance is provided between the rounded chamfer and a second extension line of the second edge line.

In at least one embodiment of the present disclosure, a start position of the touch detection lead wire is located on a side of the rounded chamfer away from the second extension line, and an end position of the touch detection lead wire is located on a side of the rounded chamfer close to the second edge line.

In at least one embodiment of the present disclosure, a notch is provided on an edge of the touch detection electrode, and the touch detection lead wire is located on a side of the notch away from the peripheral region.

In at least one embodiment of the present disclosure, a via hole is provided on the touch detection electrode, an area of an orthographic projection of the via hole on the base substrate is greater than an area of an orthographic projection of a grid on the base substrate, and a width of the grid line of the touch detection electrode adjacent to the via hole is greater than or equal to a width of the grid line of rest part.

In at least one embodiment of the present disclosure, the touch detection electrode includes:

more than one first touch unit, arranged in sequence along a first direction, where the first touch unit includes more than one first touch electrode arranged along a second direction, a first connection part is connected between two adjacent first touch electrodes, and the first direction intersects with the second direction; and more than one second touch unit, arranged in sequence along the second direction, where the second touch unit includes more than one second touch electrode arranged along the first direction, and a second connection part is connected between two adjacent second touch electrodes;

where, a via hole is provided on the touch detection electrode, an area of an orthographic projection of the via hole on the base substrate is greater than an area of an orthographic projection of a grid on the base substrate, the via hole penetrates through the first touch unit and the second touch unit, and the orthographic projection of the via hole on the base substrate does not overlap with an orthographic projection of the first connection part on the base substrate and an orthographic projection of the second connection part on the base substrate.

In at least one embodiment of the present disclosure, a width of the grid line of the first connection part adjacent to the via hole is greater than or equal to a width of the grid line of rest part, and a width of the grid line of the second connection part adjacent to the via hole is greater than or equal to a width of the grid line of the rest part.

In at least one embodiment of the present disclosure, the touch detection electrode further includes:

a first connection wire, arranged on an edge of the via hole and connected to one of the first touch electrode; and a second connection wire, arranged on an edge of the via hole and connected to one of the second touch electrode.

In at least one embodiment of the present disclosure, a width of the first connection wire is greater than or equal to a width of the grid line of the first touch unit, and a width of the second connection wire is greater than or equal to a width of the grid line of the second touch unit.

In at least one embodiment of the present disclosure, the touch detection lead wire is located in a same conductive layer as the first touch electrode and the second touch electrode, or the touch detection lead wire is located in a different conductive layer from the first touch electrode and the second touch electrode.

According to another aspect of the present disclosure, there is provided a display device, including: the display panel described in any one of the above.

It is to be understood that both the foregoing general description and the following detailed description are exemplary and explanatory and are not restrictive of the present disclosure.

BRIEF DESCRIPTION OF THE DRAWINGS

The accompanying drawings, which are incorporated in and constitute a part of the description, illustrate embodiments consistent with the disclosure and together with the description serve to explain the principles of the disclosure. Obviously, the drawings in the following description are some embodiments of the present disclosure, and for those of ordinary skill in the art, other drawings can also be obtained from these drawings without creative efforts.

EXPLANATION OF REFERENCE NUMBERS

Figure 1:
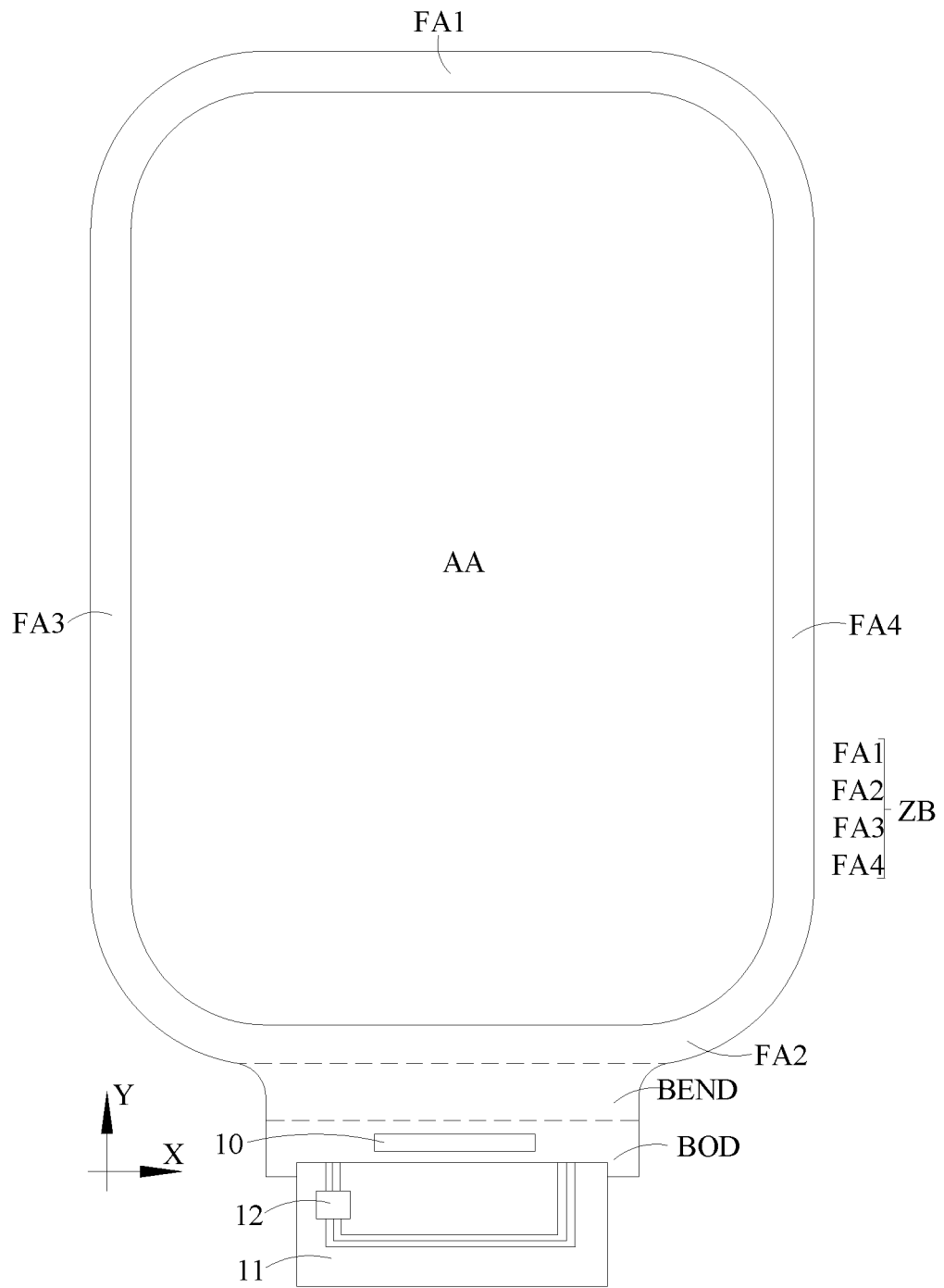
FIG. 1 is a schematic structural diagram of the region division of the display panel of the present disclosure.

1. Base substrate;
2. Driving backplane; 21. Shading layer; 22. Buffer layer; 23. Active layer; 24. Gate insulation layer; 25. Gate; 26. Interlayer dielectric layer; 271. Source; 272. Drain; 28. passivation layer;
3. Light emitting device; 31. First electrode; 32. Pixel definition layer; 33. Light emitting layer group; 34. Second electrode;
4. Encapsulation layer group;
5. Touch layer group; 51. First touch metal layer; 52. Touch insulation layer; 53. Second touch metal layer; 54. Protective layer;
6. Grid-shaped conductive part;
61. Touch detection electrode; 611. First touch unit; 6111. First touch electrode; 6112. First connection part; 612. Second touch unit; 6121. Second touch electrode; 6122. Second connection part; 613. Via hole; 614. First connection wire; 615. Second connection wire;
62. Touch detection lead wire; 621. First touch detection lead wire; 622. Second touch detection lead wire; 623. First shielding wire; 624. Second shielding wire;
63. First gap; 631. First curve; 6311. First sub-curve; 6312. Second sub-curve; 632. Line opening;
64. The second gap; 641. The second curve;
65. The third gap; 651. The third curve;
66. The fourth gap; 661. The fourth curve;
67. The fifth gap; 671. The fifth curve;
7. Peripheral touch detection lead wire; 71. First peripheral detection lead wire; 72. Second peripheral detection lead wire; 73. Third peripheral detection lead wire; 731. First layer; 732. Second layer; 733. Eighth via hole; 74. Fourth peripheral detection lead wire; 741. Third layer; 742. Fourth layer; 743. Ninth via hole; 7a. Single-layer structure; 75. Bonding pin;
8. Polarizer; 9. Cover plate; 10. Display driving chip; 11. Flexible printed circuit board; 12. Touch driving chip;
L1. Bending wire; AA. Display region; ZB. Peripheral region; FA1. First non-display region; FA2. Second non-display region; FA3. Third non-display region; FA4. Fourth non-display region; BEND. Bending region; BOD. Bonding region; B1. First edge line; B11. First extension line; B2. Second edge line; B21. Second extension line; R. Rounded chamfer;
X. First direction; Y. Second direction.

DETAILED DESCRIPTION

Example embodiments will now be described more fully with reference to the accompanying drawings. Example embodiments may, however, be embodied in many forms and should not be construed as limited to the embodiments set forth here; on the contrary, these embodiments are provided so that this disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in the description to describe the relative relationship of one component of an icon to another component, these terms are used in the description for convenience, for example, according to the direction of the example described in the accompanying drawings. It will be appreciated that if the illustrated device is turned over so that it is upside down, then components described as being "upper" will become components that are "lower". When a structure is "on" another structure, it may mean that a structure is integrally formed on another structure, or that a structure is "directly" placed on another structure, or that a structure is "indirectly" placed on another structure through another structure.

The terms "a", "an", "the", "said" and "at least one" are used to indicate the presence of one or more elements/components/etc.; the terms "comprising" and "including" are used to express the meaning of open inclusion and refer to the existence of other elements/components/etc. in addition to the listed elements/components/etc.; the terms "first", "second" and "third" etc. are used as a marker, which do not limit on the number of the objects.

In the present disclosure, unless otherwise specified and limited, the term "connection" should be understood in a broad sense, for example, "connection" can be a fixed connection, a detachable connection, or an integral body; it can be a direct connection, or an indirect connection through an intermediary. "And/or" is just an association relationship describing associated objects, which means that there can be three kinds of relationships, for example, A and/or B, which can mean three situations that: A exists alone, A and B exist at the same time, and B exists alone. In addition, the character "/" in the context generally indicates that the contextual objects are an "or" relationship.

In the related art, narrowing the frame will result in insufficient space to accommodate wires led out from the display region, and in the case of high pixel density, there is not enough space to accommodate wires led out from the display region. The purpose of the present disclosure is to overcome the shortcomings of the above-mentioned related art, and provide a display panel and a display device.

There is provided a display panel according to some embodiments of the present disclosure. Referring to FIGS. 1-20, the display panel includes a display region AA and a peripheral region ZW arranged around the display region AA. The display panel may include a base substrate 1 and a grid-shaped conductive part 6; the grid-shaped conductive part 6 is arranged on a side of the base substrate 1, and is located in the display region AA. The grid-shaped conductive part 6 may include touch detection electrodes 61 and touch detection lead wires 62; the touch detection lead wire 62 is arranged on the side of the touch detection electrode 61 close to the peripheral region ZW, and is at least partially located in the display region AA; a first gap 63 is provided between the orthographic projection of the touch detection lead wire 62 on the base substrate 1 and the orthographic projection of the touch detection electrode 61 on the base substrate 1, and the outline of the first gap 63 includes at least two first curves 631 connected in sequence.

In the display panel of the present disclosure, on the one hand, the touch detection lead wires 62 are arranged in the display region AA, so that there are fewer wires led out from the display region AA arranged in the peripheral region ZW, thus reducing the area occupied by the peripheral region ZW, and further satisfying the requirement of narrow frame of the display plane. On the other hand, a first gap 63 is arranged between the orthographic projection of the touch detection lead wire 62 on the base substrate 1 and the orthographic projection of the touch detection electrode 61 on the base substrate 1, the first gap 63 insulates the touch detection lead wire 62 from the touch detection electrode 61, preventing the touch detection lead wire 62 from affecting the touch effect of the touch detection electrode 61; on another hand, the outline of the first gap 63 includes at least two first curves 631 connected in sequence, providing a better shadow elimination effect compared with arranging the first gap 63 as a straight line.

As shown in FIG. 1, the display panel may include a display region for displaying images, a display region AA for realizing a touch function, and a peripheral region ZW for not displaying images. The peripheral region ZW may be arranged to be around the display region AA. It may further include a bending region BEND for bending and a bonding region BOD for bonding. The display region and the display region AA are the same regions.

The peripheral region ZW may include a first non-display region FA1, a second non-display region FA2, a third non-display region FA3, and a fourth non-display region FA4. The first non-display region FA1 and the second non-display region FA2 are disposed on opposite sides of the display region AA in the second direction Y. The third non-display region FA3 and the fourth non-display region FA4 are disposed on opposite sides of the display region AA in the first direction X. A bonding region BOD is provided on the side of the second non-display region FA2 away from the display region AA. Specifically, the bending region BEND is connected to the second non-display region FA2, and the bonding region BOD is connected to the bending region BEND, that is, the bending region BEND is connected between the bonding region BOD and the second non-display region FA2.

Figure 2:
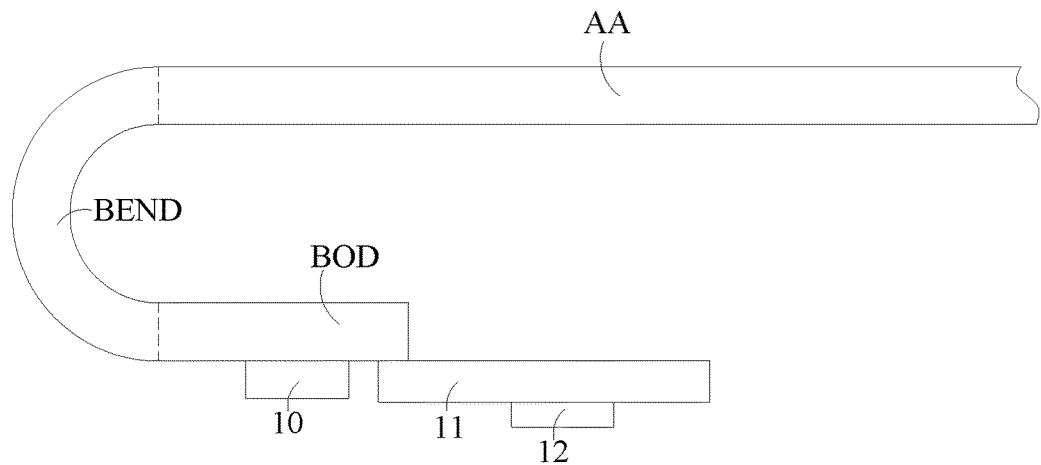
FIG. 2 is a schematic structural diagram of the display panel in FIG. 1 after being bent.

Referring to FIG. 2, the display panel are bendable at the bending region BEND, so that the bonding region BOD is bent at the side of the display region AA away from the display surface.

Referring to FIG. 1, FIG. 4, FIG. 5, FIG. 6 and FIG. 7, bonding pins 75 are provided in the bonding region BOD, and external devices can be installed (or attached) on the bonding pins 75. The external device may include a display driving chip 10, a touch driving chip 12, a flexible printed circuit board 1111 or a rigid printed circuit board and the like. In addition, chip on flex (or, chip on film, COF), connectors, etc., can also be installed on the bonding pins 75 as external devices. An external device or more than one external device may be installed in the bonding region BOD. The display driving chip 10 may be disposed in the bonding region BOD of the display panel, and a printed circuit board may be attached to an end of the bonding region BOD. In this case, the display panel may include bonding pins 75 connected to the display driving chip 10 and bonding pins 75 connected to the printed circuit board. In another embodiment, the display driving chip 10 may be mounted on a chip on film, and the chip on film may be attached to the bonding region BOD of the display panel.

Referring to FIG. 1, the display driving chip 10 may be mounted on a surface of the display panel the same as the display surface. The touch driving chip 12 can be mounted on a surface of the flexible printed circuit board 11 the same as the display surface. Referring to FIG. 2, when the bending region BEND is bent in reverse, the display driving chip 10 and the touch driving chip 12 are located on the side of the display panel away from the display surface.

The touch driving chip 12 can be bonded to the flexible printed circuit board 11 through an anisotropic conductive adhesive, or can be attached to the flexible printed circuit board 11 through ultrasonic bonding. The width of the flexible printed circuit board 11 in the first direction X may be less than the width of the display panel in the first direction X. The width of the touch driving chip 12 in the first direction X may be less than the width of the flexible printed circuit board 11 in the first direction X.

The touch driving chip 12 may include an integrated circuit for driving the touch layer group 5. In an embodiment, the integrated circuit may be a touch driving integrated circuit that generates and provides touch driving signals, but the present disclosure is not limited to this. The touch driving chip 12 is connected to the bonding pin 75 of the display panel, so as to provide the touch driving signal to the bonding pin 75 and receive the touch sensing signal fed back by the touch layer group 5.

The display panel may include a display substrate, a touch layer group 5 is arranged on the light emitting side of the display substrate. A polarizer 8 may be arranged on a side of the touch layer group 5 far away from the display substrate, and A cover plate 9 may be arranged on a side of the polarizer 8 is far away from the display substrate.

The display substrate can be an OLED (Organic Electroluminescence Display, organic light emitting semiconductor) display substrate, a QLED (Quantum Dot Light Emitting Diode) display substrate, etc. The display substrate is provided with a light emitting side and a non-light emitting side. The light emitting side and the non-light emitting side are arranged opposite to each other, a screen can be displayed on the light emitting side, and the side for displaying the screen is the display surface. OLED display substrates have the characteristics of self-illumination, high brightness, wide viewing angle, fast response time, and that R, G, and B full-color components can be produced, so they are regarded as star products for next-generation displays.

The OLED is taken as an example for description below.

Figure 3:
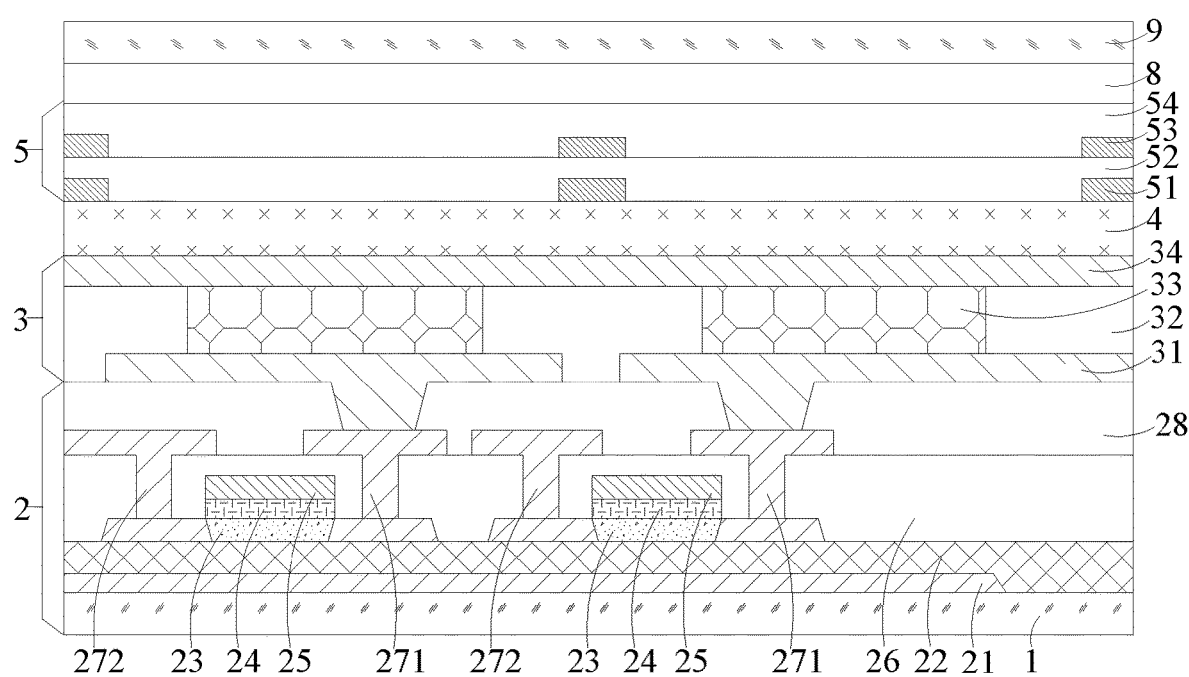
FIG. 3 is a schematic sectional structural diagram of the display region of the display panel in FIG. 1.

Referring to FIG. 3, the display substrate may include a driving backplane 2 and a light emitting device 3. The driving backplane 2 may include a driving circuit, and the driving circuit may drive the light emitting device 3 to emit light.

In the example embodiment, as shown in FIG. 3, the driving backplane 2 may include a base substrate 1, and the material of the base substrate 1 may include an inorganic material, for example, the inorganic material may be glass, quartz, or metal, etc. The material of the base substrate 1 may also include an organic material, for example, the organic material may be polyimide, polycarbonate, polyacrylate, polyetherimide, polyether sulfone, polyethylene terephthalate, polyethylene naphthalate and other resin materials. The base substrate 1 may be formed of a plurality of material layers, for example, the base substrate 1 may include a plurality of base layers, and the material of the base layer may be any one of the above-mentioned materials. The base substrate 1 can also be arranged as a single layer, which can be any one of the above materials.

A light-shielding layer 21 may also be provided on a side of the base substrate 1, and the light incident from the base substrate 1 into the active layer 23 will generate photocarriers in the active layer 23, thus greatly affecting the characteristics of the thin film transistor, which ultimately affects the display quality of the display device; the light incident from the base substrate 1 can be blocked by the light-shielding layer 21, so as to avoid affecting the characteristics of the thin film transistor and the display quality of the display device.

A buffer layer 22 can also be formed on the side of the light-shielding layer 21 away from the base substrate 1. The buffer layer 22 plays a role of blocking water vapor and impurity ions in the base substrate 1 (especially organic materials), and plays a role in adding hydrogen ions to the subsequent active layer 23. The material of the buffer layer 22 is an insulation material, which can insulate and isolate the light shielding layer 21 from the active layer 23.

An active layer 23 is arranged on the side of the buffer layer 22 away from the base substrate 1. The active layer 23 may include a channel part and conductor parts arranged at both ends of the channel part. A gate insulation layer 24 is arranged on a side of the gate insulation layer 24, a gate 25 is arranged on a side of the gate insulation layer 24, and an interlayer dielectric layer 26 is arranged on a side of the gate 25 far away from the base substrate 1. A first via hole is provided on the interlayer dielectric layer 26, and the first via hole is connected to the conductor part. A source 271 and a drain 272 are provided on the side of the interlayer dielectric layer 26 away from the base substrate 1, and the source 271 and the drain 272 are respectively connected to two conductor parts through two first via holes. A passivation layer 28 is provided on the side of the source electrode 271 and the drain electrode 272 away from the base substrate 1, a second via hole is provided on the passivation layer 28, and the second via hole is connected to the source electrode 271. The active layer 23, the gate 25, the source 271 and the drain 272 form a thin film transistor.

It should be noted that the thin film transistor described in the description is a top-gate thin film transistor. In other example embodiments of the present disclosure, the thin film transistor may also be a bottom-gate or double-gate type, and the specific structure of it will not be described here. Furthermore, when using thin film transistors with opposite polarities or when the direction of current changes during circuit operation, the functions of the "source 271" and "drain 272" may be interchanged sometimes. Therefore, in this specification, "source 271" and "drain 272" can be interchanged with each other.

Continuing to refer to FIG. 3, a light emitting device 3 is provided on the side of the passivation layer 28 away from the base substrate 1, and the light emitting device 3 may include a first electrode 31, a pixel definition layer 32, a light emitting layer group 33 and a second electrode 34.

Specifically, a first electrode 31 is provided on the side of the passivation layer 28 away from the substrate 1, and the first electrode 31 is connected to the source 271 of the driving backplane 2 through a second via hole 613. The first electrode 31 can be an anode (pixel electrode).

A pixel definition layer 32 is provided on the side of the first electrode 31 away from the base substrate 1, a third via hole is provided on the pixel definition layer 32, and a light emitting layer group 33 is provided in the third via hole. A second electrode 34 is provided on the side of the light emitting layer group 33 away from the base substrate 1. The second electrode 34 may be a cathode (common electrode), and the second electrode 34 is connected to the ground line VSS. The light emitting layer group 33 in a third via hole emits light to form a sub-pixel, thus, the light emitting layer group 33 in a third via hole is a sub-pixel, so that the orthographic projection of the sub-pixel on the display substrate is the orthographic projection of the light emitting layer group 33 on the display substrate. The display substrate may include more than one sub-pixel.

The light emitting layer group 33 may include a hole injection layer, a hole transmission layer, a light emitting layer, an electron transmission layer, and an electron injection layer stacked in sequence. The hole injection layer is in contact with the first electrode 31, and the electron injection layer is in contact with the second electrode 34. In other example embodiments of the present disclosure, the light emitting layer group 33 may include a hole transmission layer, a light emitting layer, and an electron transmission layer, and the light emitting layer group 33 may also have other structures, the specific structure of which may be arranged according to needs.

An encapsulation layer group 4 is provided on the side of the second electrode 34 away from the base substrate 1. The encapsulation layer group 4 can be provided as a plurality of layers, and the encapsulation layer group 4 can include organic layers and inorganic layers. Specifically, the encapsulation layer group 4 can include a first inorganic layer, an organic layer provided on the side of the first inorganic layer away from the base substrate 1, and a second inorganic layer provided on the side of the organic layer away from the base substrate 1. The materials of the first inorganic layer, the organic layer and the second inorganic layer will not be repeated here. The encapsulation layer group 4 may also include more layers or fewer layers.

In the example embodiment, referring to FIG. 3, a touch layer group 5 is provided on the side of the encapsulation layer group 4 away from the base substrate 1, and the touch layer group 5 may include a first touch metal layer 51, a touch insulation layer 52, a second touch metal layer 53 and a protective layer 54. The first touch metal layer 51 is provided on the side of the encapsulation layer group 4 away from the base substrate 1, the touch insulation layer 52 is provided on the side of the first touch metal layer 51 away from the base substrate 1, the second touch metal layer 53 is provided on the side of the touch insulation layer 52 away from the base substrate 1, and the protection layer 54 is provided on the side of the second touch metal layer 53 away from the base substrate 1.

The first touch metal layer 51 and the second touch metal layer 53 form a grid-shaped conductive part 6, which is formed by interweaving more than one metal wire, that is, the grid-shaped conductive part 6 includes more than one grid. A grid is a polygon formed by more than one grid line. A grid corresponds to a sub-pixel, and the orthographic projection of the sub-pixel on the base substrate 1 is located within the orthographic projection of the grid on the base substrate 1, so as to prevent the grid lines from blocking the light emitted by the sub-pixel and ensure the display effect of the display panel.

The grid-shaped conductive part 6 is formed by at least one metal material of aluminum (Al), copper (Cu), silver (Ag), molybdenum (Mo), and alloys of them.

Referring to FIG. 4, FIG. 5, FIG. 6 and FIG. 7, the grid-shaped conductive part 6 may include a touch detection electrode 61. The touch detection electrode 61 may be of a mutual capacitance structure. The touch detection electrode 61 may include more than one first touch unit 611 and more than one second touch unit 612. The first touch unit 611 and the second touch unit 612 further include more than one grid, and the grid is a polygon formed by more than one grid line. The first touch unit 611 and the second touch unit 612 in metal mesh form have the advantages of low resistance, small thickness and fast response speed.

Referring to FIG. 4, FIG. 5, FIG. 6 and FIG. 7, the second touch unit 612 has a line shape extending along the first direction X, and more than one second touch unit 612 is arranged in sequence along the second direction Y. The first touch unit 611 has a line shape extending along the second direction Y, more than one first touch unit 611 is arranged in sequence along the first direction X, and the first direction X intersects with the second direction Y. Each first touch unit 611 may include more than one first touch electrode 6111 and a first connection part 6112 arranged in sequence along the second direction Y. More than one first touch electrode 6111 is arranged at intervals, and the adjacent first touch control electrodes 6111 are connected to each other through the first connection part 6112. Each second touch unit 612 may include more than one second touch electrode 6121 and a second connection part 6122 arranged in sequence along the first direction X. More than one second touch electrode 6121 is arranged at intervals, and adjacent second touch control electrodes 6121 are connected to each other through the second connection part 6122.

In some example embodiments, the first touch electrode 6111, the second touch electrode 6121 and the second connection part 6122 are arranged in a same layer, and can be formed through a patterning process. The second touch electrode 6121 and the second connection part 6122 is an integral structure. The first connection part 6112 can be provided on the bridge layer to form a bridge structure, and a touch insulation layer 52 is provided between the first connection part 6112 and the second connection part 6122.

Figure 11:
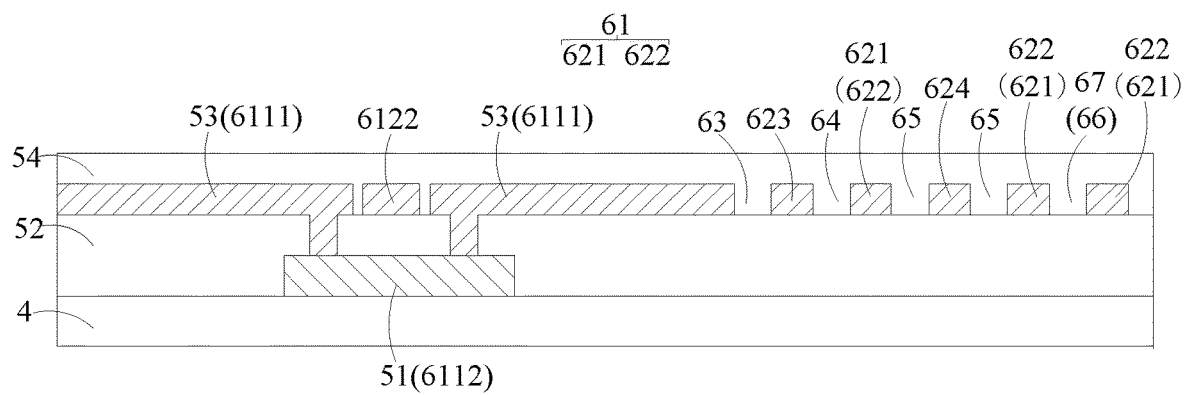
FIG. 11 is a schematic sectional structure diagram of some embodiments of a touch layer group of a display panel of the present disclosure.
Figure 12:
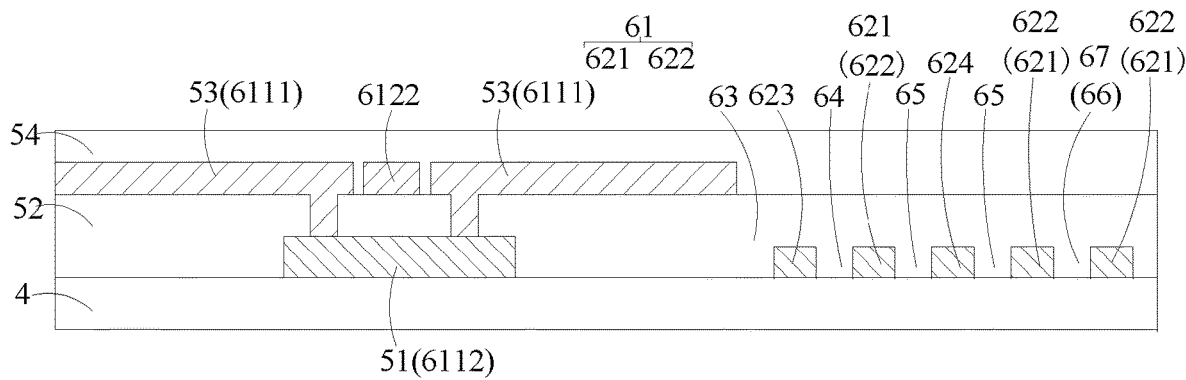
FIG. 12 is a schematic sectional structure diagram of some other embodiments of the touch layer group of the display panel of the present disclosure.

For example, referring to FIG. 11 and FIG. 12, the second touch metal layer 53 may include a first touch electrode 6111, a second touch electrode 6121 (not shown in the drawing) and a second connection part 6122. The second touch control electrode 6121 and the second connection part 6122 are connected as a whole in the second touch metal layer 53. Moreover, a gap is provided between the first touch electrode 6111 and the second touch electrode 6121 and the second connection part 6122. The gap is achieved by means of broken lines of the metal grid. The first touch metal layer 51 may include a first connection part 6112, and the first connection part 6112 is connected to two adjacent first touch electrodes 6111 through a fourth via hole provided on the touch insulation layer 52, so as to achieve the purpose of connecting more than one first touch electrode 6111 sequentially arranged along the second direction Y as a whole.

As the driving backplane 2 needs to be connected with an electrical signal, the first touch electrode 6111, the second touch electrode 6121 and the second connection part 6122 also need to be connected with electrical signals. The first touch electrode 6111, the second touch electrode 6121 and the second connection part 6122 are farther away from the driving backplane 2 than the first touch metal layer 51, reducing the interference of electrical signals between the driving backplane 2 and the first touch electrode 6111, the second touch electrode 6121 and the second connection part 6122, ensuring the display effect and touch effect of the display panel. In some other example embodiments of the present disclosure, the first touch metal layer 51 may also include a first touch electrode 6111, a second touch electrode 6121 and a second connection part 6122, and the second touch metal layer 53 may also include a first connection part 6112.

In some other example embodiments, the first touch electrode 6111, the first connection part 6112 and the second touch electrode 6121 are arranged in a same layer, and can be formed by a patterning process. The first touch electrode 6111 and the first connection part 6112 is an integral structure, the second connection part 6122 can be provided on the bridge layer to form a bridge structure, and an insulation layer is provided between the first connection part 6112 and the second connection part 6122.

For example, the second touch metal layer 53 may include a first touch electrode 6111, a second touch electrode 6121 and a first connection part 6112. The first touch electrode 6111 and the first connection part 6112 are connected as a whole within the second touch metal layer 53. Moreover, a gap is provided between the second touch electrode 6121 and the first touch electrode 6111 and the first connection part 6112, and the gap is realized by means of broken lines of the metal grid. The first touch metal layer 51 may include a second connection part 6122, and the second connection part 6122 is connected to two adjacent second touch electrodes 6121 through the fourth via hole provided on the touch insulation layer 52, so as to achieve the purpose of connecting more than one second touch electrode 6121 sequentially arranged along the first direction X as a whole. In some other example embodiments of the present disclosure, the first touch metal layer 51 may also include a first touch electrode 6111, a second touch electrode 6121 and a first connection part 6112, and the second touch metal layer 53 may also include a second connection part 6122.

In some example embodiments, the first touch electrode 6111 may be a driving electrode, and the second touch electrode 6121 may be sensing electrode. Alternatively, the first touch electrode 6111 may be a sensing electrode, and the second touch electrode 6121 may be a driving electrode. More than one first touch unit 611 and more than one second touch unit 612 form M rows of driving electrodes*N columns of sensing electrodes, that is, M first touch units 611 and N second touch units 612 are included, and M and N is a positive integer greater than two.

In some example embodiments, the first touch electrode 6111 and the second touch electrode 6121 may have a rhombus shape, for example, may be a regular rhombus, or a horizontally long rhombus, or a vertically long rhombus. In some possible embodiments, the first touch electrode 6111 and the second touch electrode 6121 may have any one or more shapes of triangle, square, trapezoid, parallelogram, pentagon, hexagon and other polygon, which is not limited in the present disclosure here.

Figure 4:
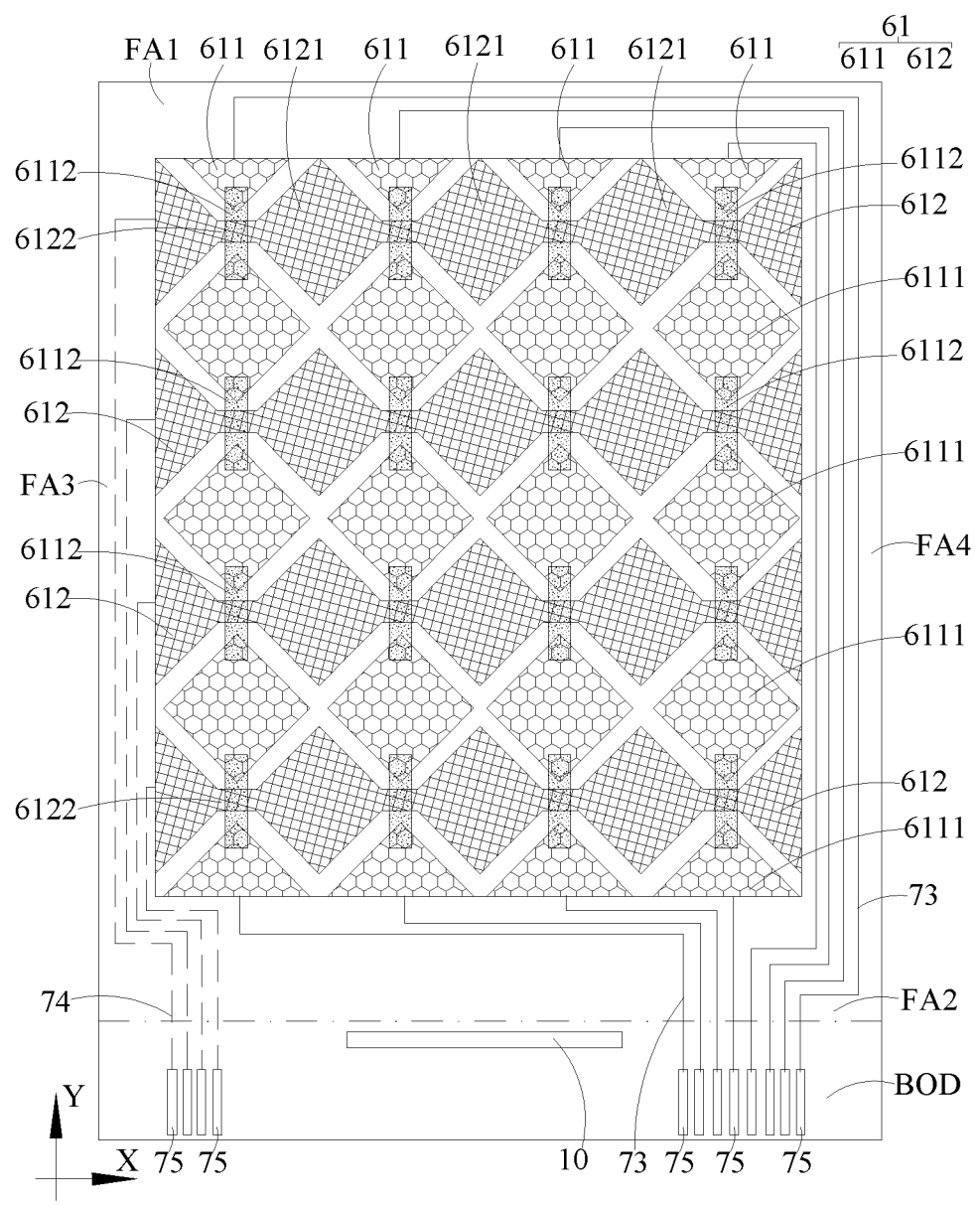
FIG. 4 is a schematic structural diagram from top view of some embodiments of a touch layer group of a display panel in the related art.
Figure 5:
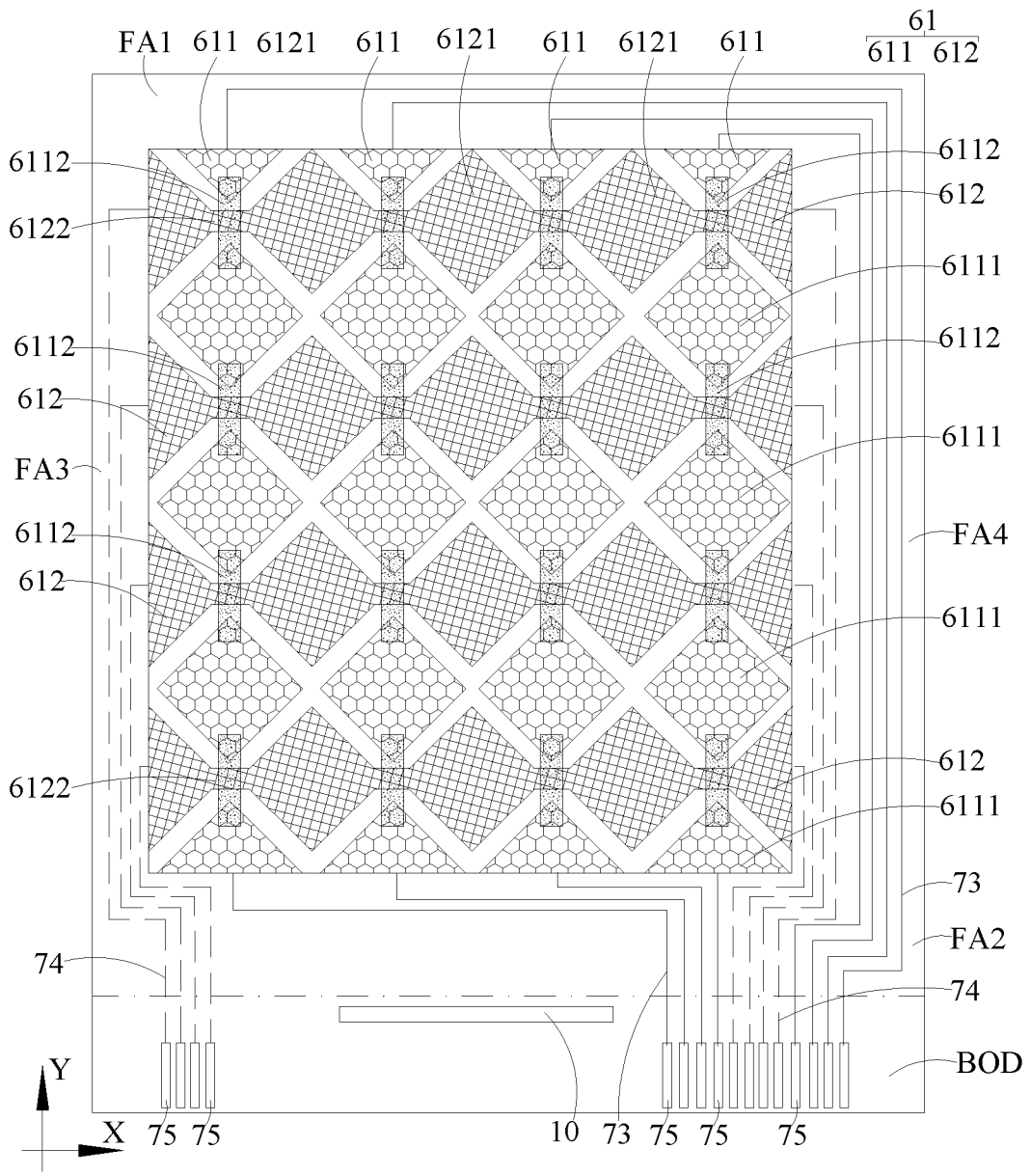
FIG. 5 is a schematic structural diagram from top view of some other embodiments of a touch layer group of a display panel in the related art.

Referring to FIG. 4 and FIG. 5, in the peripheral region ZW, peripheral touch detection lead wires 7 are provided, and the peripheral touch detection lead wire 7 may include a third peripheral detection lead wire 73 and a fourth peripheral detection lead wire 74 (different lead wires are distinguished by different line types in the drawing for clarity).

A first end of a part of the third peripheral detection lead wire 73 is correspondingly connected to an end of the first touch unit 611, and a second end of the third peripheral detection lead wire 73 is led out to the bonding pin 75 and connected with the bonding pin 75. A first end of another part of the third peripheral detection lead wire 73 is correspondingly connected to an opposite end of the first touch unit 611, and a second end of another part of the third peripheral detection lead wire 73 is led out to the bonding pin 75 and connected with the bonding pin 75.

Figure 6:
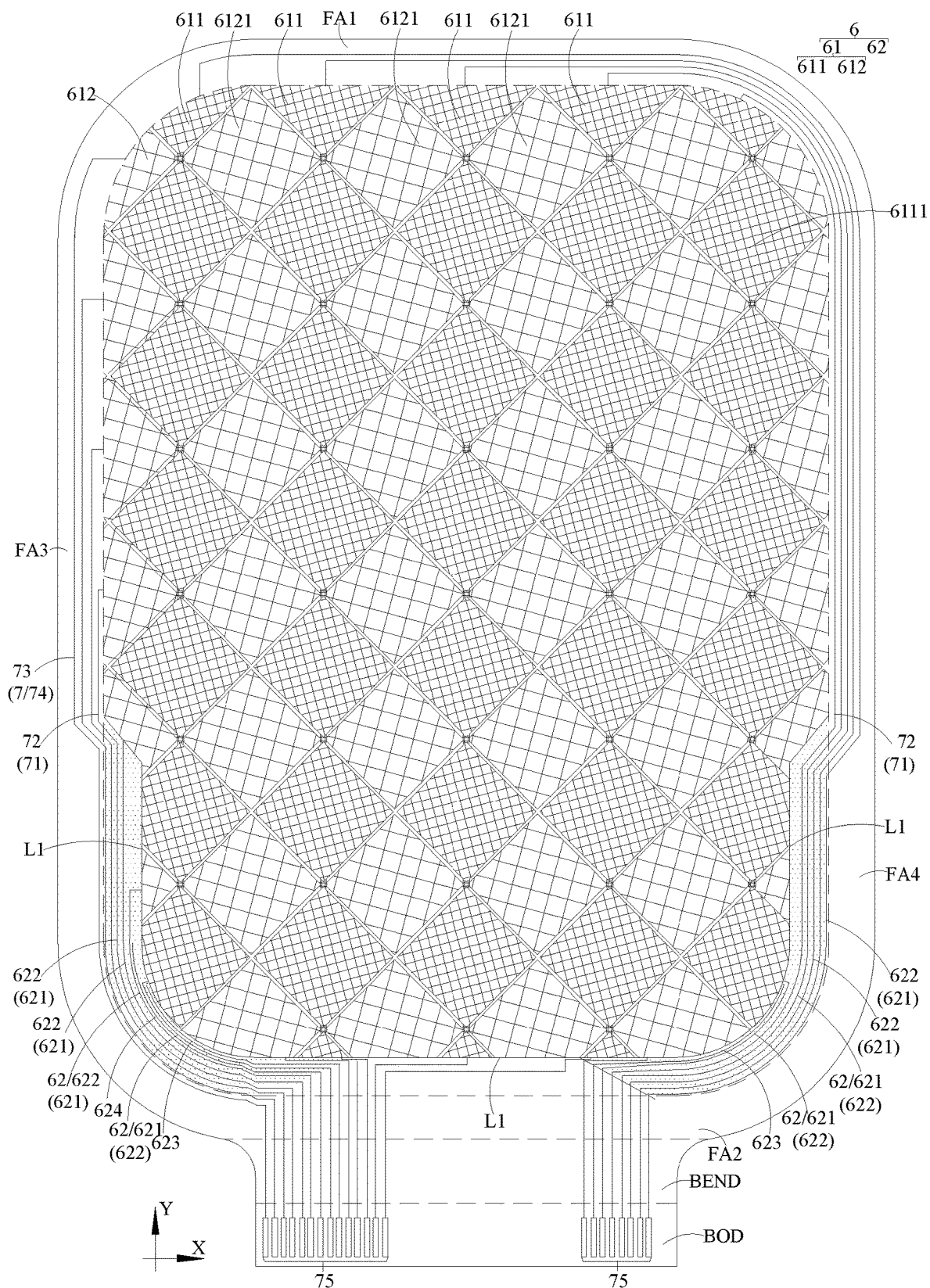
FIG. 6 a schematic structural diagram from top view of some embodiments of a touch layer group of a display panel of the present disclosure.

Referring to FIG. 4 and FIG. 6, a first end of the fourth peripheral detection lead wire 74 is correspondingly connected to an end of the second touch unit 612, a second end of the fourth peripheral detection lead wire 74 is led out to the bonding pin 75 and connected with the bond pin 75. The wiring mode shown in FIG. 4 and FIG. 6 can also be called 2TIR (where, the first touch unit 611 is a touch driving unit, and the second touch unit 612 is a touch sensing unit). It can also be 1T2R (the first touch unit 611 is a touch sensing unit, and the second touch unit 612 is a touch driving unit).

It can be understood that the first touch electrodes 6111 in a same row are arranged in sequence along the second direction Y (the long side of the display region AA), and the number of the first touch electrodes 6111 included in a row of first touch units 611 is relatively large. The touch signal starts from the first one of the first touch electrode 6111 coupled with the third peripheral detection lead wire 73, along the direction away from the third peripheral detection lead wire 73, and transmits sequentially along a row of first touch electrodes 6111. However, as the transmission distance increases, the touch signal will gradually attenuate. Based on this, when the number of first touch electrodes 6111 is large, the two ends of a same row of first touch electrodes 6111 are respectively coupled to the third peripheral detection lead wire 73, ensuring that the first touch electrode 6111 among a row of first touch electrodes 6111 farthest from the third peripheral detection lead wire 73 receives the touch signal.

Figure 7:
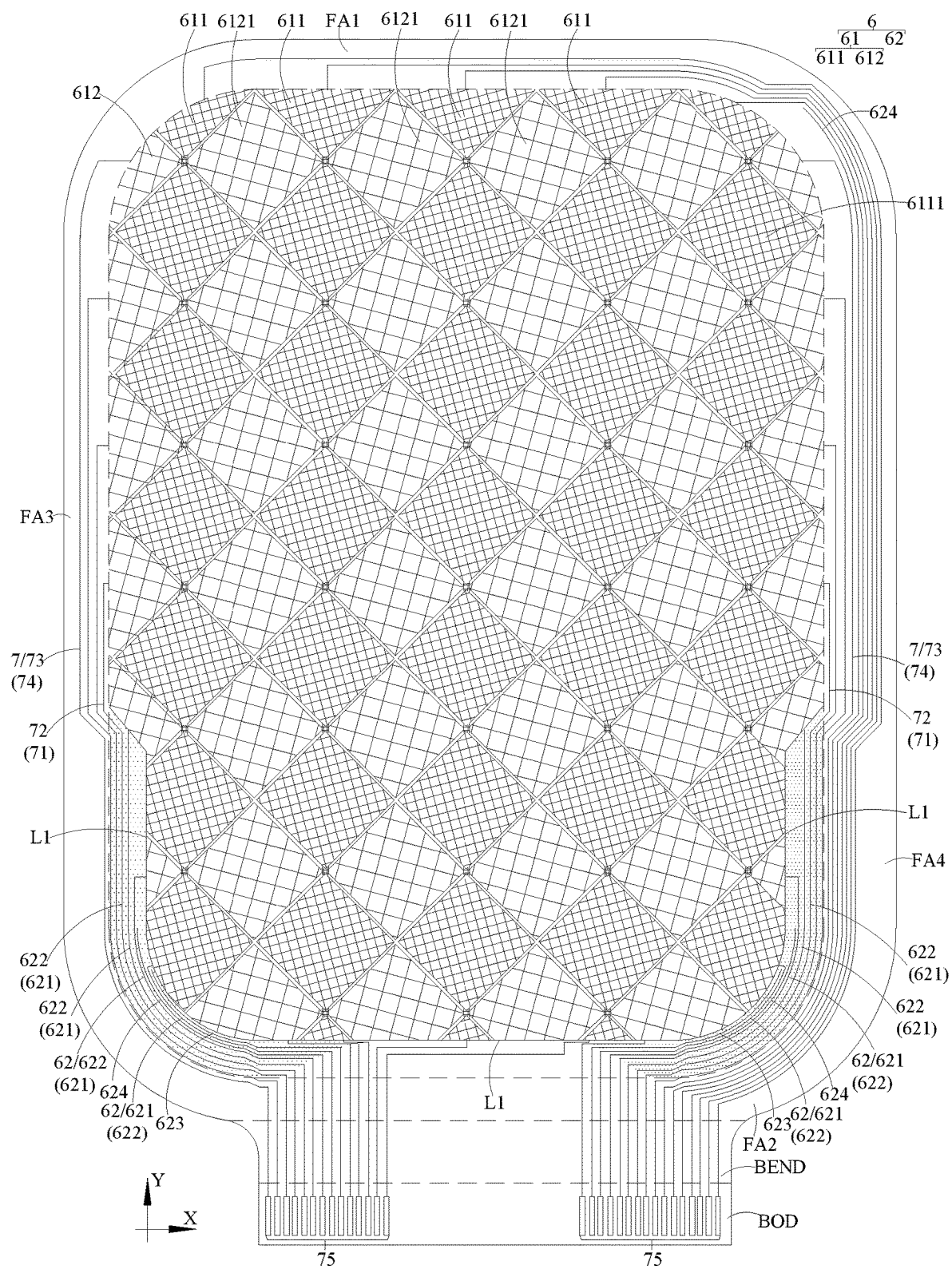
FIG. 7 is a schematic structural diagram from top view of some other embodiments of the touch layer group of the display panel of the present disclosure.

Referring to FIG. 5 and FIG. 7, the fourth peripheral detection lead wire 74 is arranged in two parts, a first end of a part of the fourth peripheral detection lead wire 74 is correspondingly connected to an end of the second touch unit 612, and a second end of the fourth peripheral detection lead wire 74 is led out to the bonding pin 75 and connected with the bonding pin 75. A first end of the other part of the fourth peripheral detection lead wire 74 is correspondingly connected to an opposite end of the second touch unit 612, and a second end of the other part of the fourth peripheral detection lead wire 74 is led out to the bonding pin 75 and connected with the bonding pin 75.

The wiring mode shown in FIG. 5 and FIG. 7 can also be called 2T2R. This wiring mode can ensure that among the row of touch electrode blocks coupled with the touch lead wires, the touch signal received by the touch electrode block farther away from the touch lead wire is not much different from the touch signal received by the touch electrode block closer to the touch lead wire, so as to ensure the touch accuracy of the relatively large touch screen.

In some example embodiments, as shown in FIG. 4 and FIG. 5, a first end of a part of the third peripheral detection lead wire 73 is connected to an end of the first touch unit 611 adjacent to the bonding region BOD, and the third peripheral detection lead wire 73 passes through the second non-display region FA2, so that a second end can be directly led out to the bonding pin 75. A first end of the other part of the third peripheral detection lead wire 73 is connected to an end of the first touch unit 611 away from the bonding region BOD, and this part of the third peripheral detection lead wire 73 needs to pass through the first non-display region FA1, the fourth non-display region FA4 and the second non-display region FA2, so that the second end can be led out to the bonding pin 75.

A first end of a part of the fourth peripheral detection lead wire 74 is correspondingly connected to an end of the second touch unit 612, and the fourth peripheral detection lead wire 74 needs to pass through the third non-display region FA3 and the second non-display region FA2, so that a second end is led out to bond pin 75. A first end of the other part of the fourth peripheral detection lead wire 74 is correspondingly connected to an opposite end of the second touch unit 612, and this part of the fourth peripheral detection lead wire 74 needs to pass through the fourth non-display region FA4 and the second non-display region FA2, so that a second end can be led out to the bonding pin 75.

The touch principle is that: the second touch electrode 6121 and the first touch electrode 6111 can form a capacitor, and more than one first touch electrode 6111 and more than one second touch electrode 6121 can form more than one capacitor (such as C1, C2, C3 . . . ). Each capacitor is at a different position in the touch detection electrode 61. It can also be said that in the coordinate system formed by the first direction X and the second direction Y, each capacitor is located at a different point. The touch driving chip 12 transmits a touch driving signal (such as a trigger signal) to the third peripheral detection lead wire 73, and the touch driving signal is transmitted to the first touch electrode 6111 through the third peripheral detection lead wire 73. At this time, each capacitor at the above-mentioned different positions has an initial capacitance value. Since the human body itself is a conductor, when a human finger touches a certain position of the display panel, the capacitance value of the capacitor at that position will change. According to the variation of the capacitance value, the second touch electrode 6121 at the position will receive a corresponding touch sensing signal (for example, a receiving signal). The touch sensing signal on the second touch electrode 6121 at the position is transmitted to the touch driving chip 12 through the fourth peripheral detection lead wire 74. The capacitance value of the capacitor at the untouched position does not change. Therefore, by judging the capacitance value of each capacitor, the touch point can be determined, thus realizing the touch function.

Referring to FIG. 4 and FIG. 5, since all peripheral touch detection lead wires 7 need to be connected to the bonding pin 75, therefore, the closer to the bonding region BOD, the more the number of peripheral touch detection lead wires 7, which results in that the third non-display region FA3, the fourth non-display region FA4, and the second non-display region FA2 close to the bonding region BOD need to accommodate more peripheral touch detection lead wires 7, and cannot accommodate more peripheral touch detection lead wires 7 under the need of a narrow frame.

In order to realize the narrow frame, in the example embodiment, referring to FIG. 6 and FIG. 7, the regions filled with dots in the drawing are all with the grid-shaped conductive parts 6 being taken as the touch detection lead wires 62. The grid-shaped conductive part 6 can further include the touch detection lead wire 62. The touch detection lead wire 62 is arranged on the side of the touch detection electrode 61 close to the peripheral region ZW. Specifically, the touch detection lead wire 62 is located within a part of the peripheral region ZW close to the display region AA.

Referring to FIG. 11, the touch detection lead wire 62 can be arranged on the second touch metal layer 53, that is, the touch detection lead wire 62 can be arranged on a same layer as the first touch electrode 6111, the second touch electrode 6121 and the second connection part 6122. In this case, a first gap 63 is provided between the touch detection lead wire 62 and the touch detection electrode 61. There will also be a first gap 63 between the orthographic projection of the touch detection lead wire 62 on the base substrate 1 and the orthographic projection of the touch detection electrode 61 on the base substrate 1. Since data lines and scan lines are also arranged on the driving backplane 2 in the peripheral region ZW, the touch detection lead wire 62 is farther away from the driving backplane 2 than the first touch metal layer 51. Based on such arrangement, the interference of the electrical signal of the driving backplane 2 and the touch detection lead wire 62 can be reduced, ensuring the display effect and touch effect of the display panel.

In some other example embodiments of the present disclosure, as shown in FIG. 12, the touch detection lead wire 62 can also be provided on the first touch metal layer 51, that is, the touch detection lead wire 62 and the first connection part 6112 are arranged on a same layer. In this case, a first gap 63 is provided between the orthographic projection of the touch detection lead wire 62 on the base substrate 1 and the orthographic projection of the touch detection electrode 61 on the base substrate 1.

It can be understood that the touch detection lead wire 62 can also be provided on the first touch metal layer 51 together with the first touch electrode 6111, the second touch electrode 6121 and the second connection part 6122, and can also be provided on the second touch metal layer 53 together with the first connection part 6112.

Figure 8:
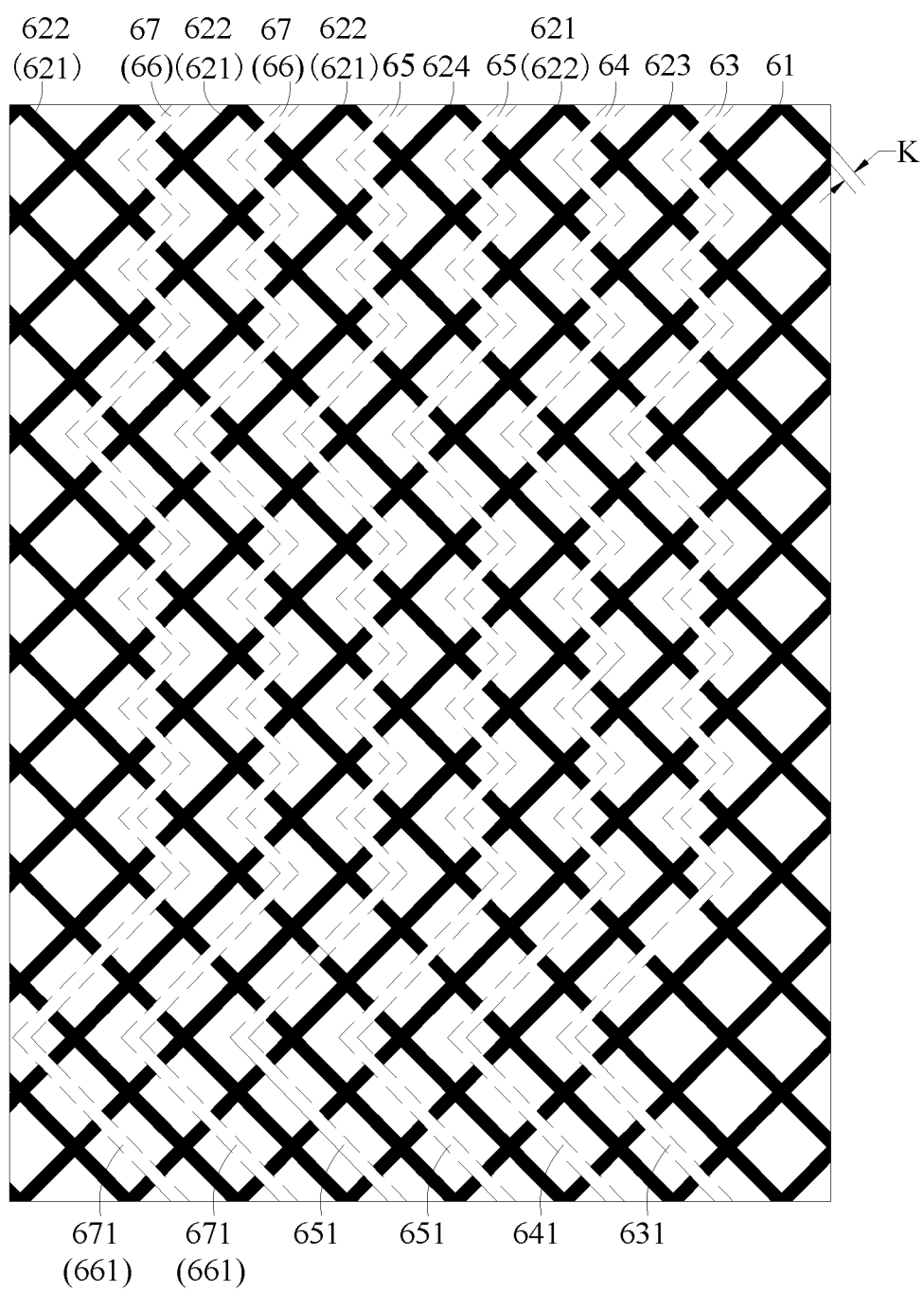
FIG. 8 is a partially enlarged structural schematic diagram of some embodiments of the grid-shaped conductive part in FIG. 6 and FIG. 7 as a touch detection lead wire.
Figure 9:
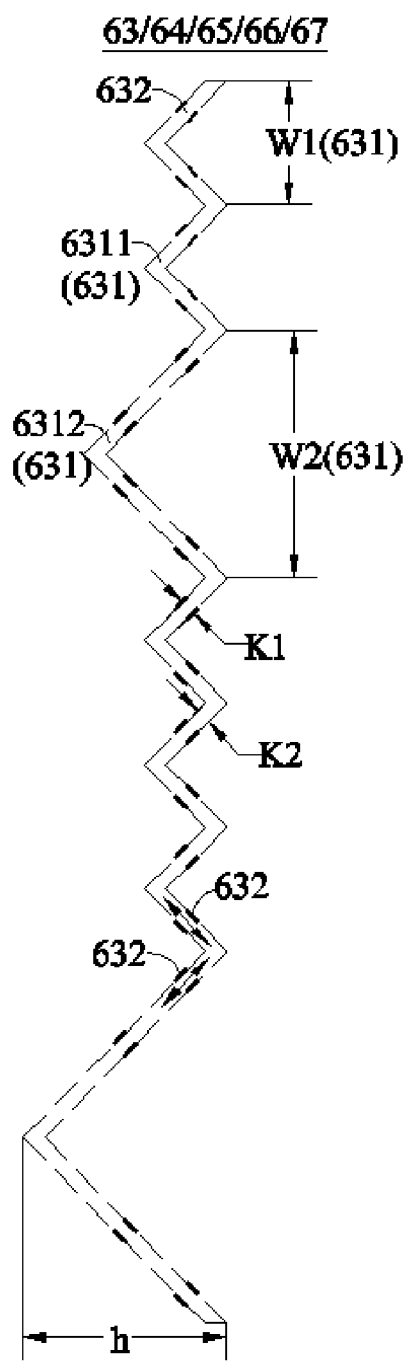
FIG. 9 is a schematic structural view of the first gap, the second gap, the third gap, the fourth gap and the fifth gap in FIG. 8.

Referring to FIG. 8 and FIG. 9, the first gap 63 may include more than one line opening 632, the line openings 632 disconnecting more than one grid line to form the touch detection electrode 61 and the touch detection lead wire 62, that is, the touch detection electrode 61 is on a side of the line opening 632, and the touch detection lead wire 62 is on the other side of the line opening 632. The first gap 63 is formed by connecting more than one line opening 632. The inclination direction of more than one line opening 632 is not on a same straight line. The inclination direction of the line opening 632 is represented by a double arrow in FIG. 9. A first curve 631, so that the outline of the first gap 63 formed by the connection of more than one line opening 632 can include at least two first curves 631 connected in sequence. For example, the first curve 631 can be formed by connecting the central point of a grid with at least two adjacent line openings 632, it can also be formed by connecting at least two adjacent line openings 632.

Moreover, the orthographic projection of the line opening 632 on the base substrate 1 and the orthographic projection of the intersection of the grid line on the base substrate 1 do not overlap with each other, that is, the line opening 632 is not arranged at the position of the intersection part of the grid line.

Both the grid-shaped conductive part 6 and the line opening 632 are formed by metal layer etching to the entire layer setting, and the position of the intersection part is the position where more than one wire is connected. If the line opening 632 is arranged at the position of the intersection part of the grid lines, that is, the grid lines form a line opening 632 at the position of the intersection part, in the case that there is one touch detection lead wire 62, it is easy to cause the touch detection lead wire 62 to form a broken line, resulting in an open circuit. If it is needed to ensure the connection effect, the requirement on etching precision is higher, leading to increased costs. By setting the line opening 632 away from the intersection part, it can be avoided that the touch detection lead wire 62 forms broken lines when there is one touch detection lead wire 62, ensuring the connection effect of the touch detection lead wire 62. Moreover, there is no high requirement on the etching precision, which will not lead to increased costs. In addition, the above structure and effect can be realized without too much modification to the existing mask.

The outline of the first gap 63 may include at least two first curves 631 connected in sequence, and the at least two first curves 631 have at least two different waveforms. Different waveforms can include triangular waves, semicircular waves, and trapezoidal waves, etc. As shown in FIG. 8 and FIG. 9, the two different waveforms can both be triangular waves, but the amplitudes and periods of the triangular waves are different. In addition, specifically, the outline of the first gap 63 may include two first curves 631, one of the first curves 631 may be a triangular wave, and the other one of the first curves 631 may be a trapezoidal wave. The outline of the first gap 63 may include more than one first curve 631, one of the first curves 631 may be a triangular wave, and several other first curves 631 may be trapezoidal waves. The outline with different waveforms further enhances the blanking effect. The outline of the first gap 63 may also include more than one base line, and the base line may be connected between two adjacent first curved lines 631.

Figure 10:
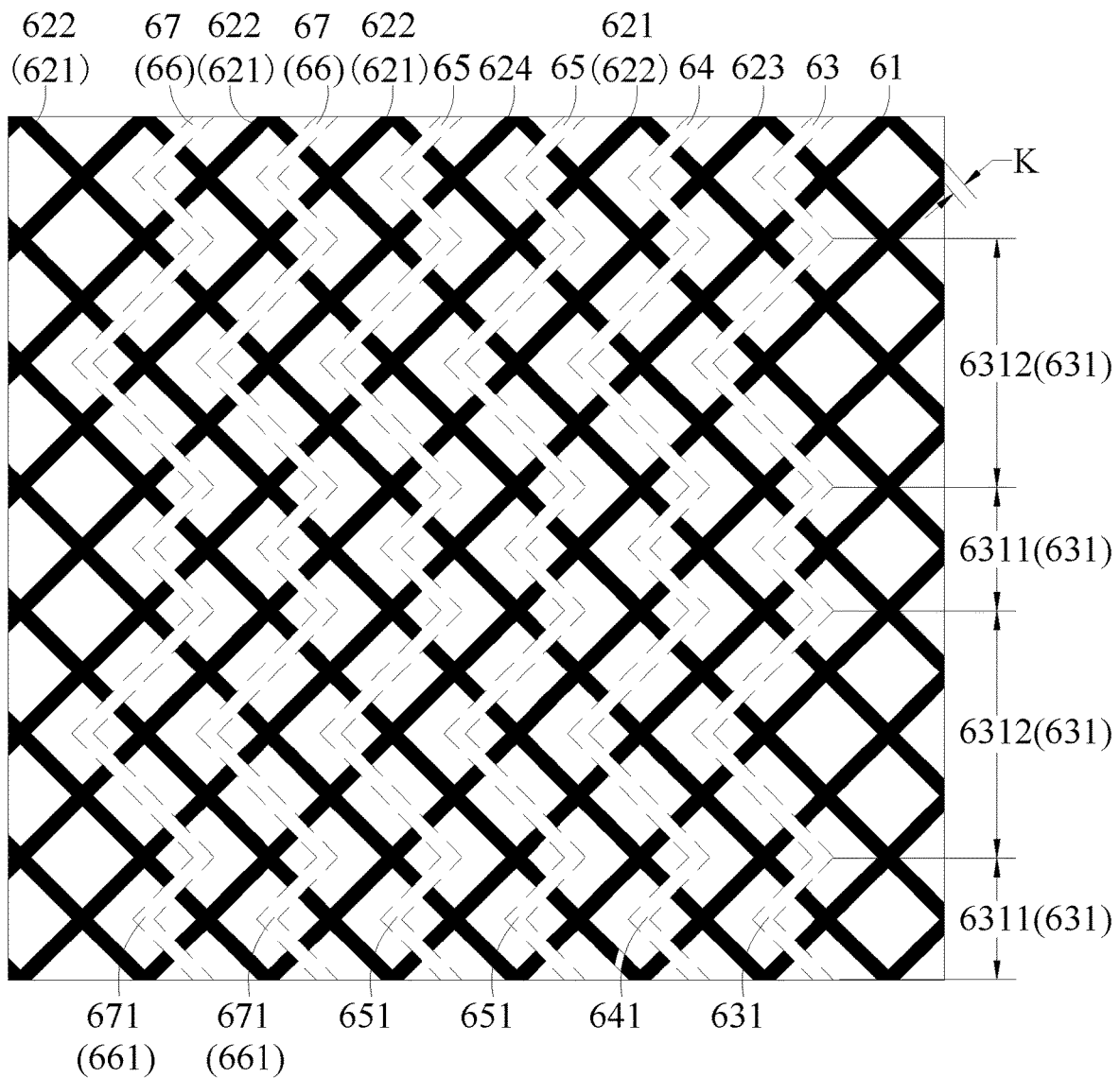
FIG. 10 is a partially enlarged structural schematic diagram of some other embodiments of the grid-shaped conductive part in FIG. 6 and FIG. 7 as the touch detection lead wire.

Referring to FIG. 10, the first curves of at least two different waveforms are alternately connected to form the first gap. For example, for convenience of description and identification in the drawing, the first curves 631 of two different waveforms may be the first sub-curve 6311 and the second sub-curve 6312, the amplitude and period of the first sub-curve 6311 are relatively small, and the amplitude and period of the second sub-curve 6312 are relatively large. The first sub-curve 6311 and the second sub-curve 6312 are alternately arranged and connected to form the first gap. That is, a second sub-curve 6312 is arranged between two adjacent first sub-curves 6311. That is, a first sub-curve 6311 is arranged between two adjacent second sub-curves 6312.

Optionally, the average height h of the first curve 631 is in the range of 30 μm to 90 μm, for example, 30 μm to 40 μm, 40 μm to 50 μm, 50 μm to 60 μm, 60 μm to 70 μm, 70 μm to 80 μm, or 80 μm to 90 μm. Optionally, the average height h of more than one first curve 631 is 60 μm.

Optionally, the average width W1 of the first sub-curve 6311 (smaller in amplitude and period) is in the range of 20 μm to 80 μm, for example, 20 μm to 30 μm, 30 μm to 40 μm, 40 μm to 50 μm, 50 μm to 60 μm, 60 μm to 70 μm, or 70 μm to 80 μm. Optionally, the average width W1 of the first sub-curve is 40 μm.

Optionally, the average width W2 of the second sub-curve 6312 (larger in amplitude and period) is in the range of 60 μm to 240 μm, 60 μm to 70 μm, 70 μm to 80 μm, 80 μm to 90 μm, 90 μm to 100 μm, 100 μm to 110 μm, 110 μm to 120 μm, 120 μm to 130 μm, 130 μm to 140 μm, 140 μm to 150 μm, 150 μm to 160 μm, 160 μm to 170 μm, 170 μm to 180 μm, 180 μm to 190 μm, 190 μm to 200 μm, 200 μm to 210 μm, 210 μm to 220 μm, 220 μm to 230 μm, or 230 μm to 240 μm. Optionally, the average width W2 of the second sub-curve is 120 μm.

Optionally, the average line width K of the grid lines is in the range of 1 μm to 10 μm, for example, 1 μm to 2 μm, 2 μm to 3 μm, 3 μm to 4 μm, 4 μm to 5 μm, 5 μm to 6 μm, 6 μm to 7 μm, 7 μm to 8 μm, 8 μm to 9 μm, or 9 μm to 10 μm. Optionally, the average line width of the grid lines is 3 μm. Optionally, the average line width K of the grid lines is 4 μm or 4.5 μm.

Optionally, the average width K1 of more than one line opening 632 is in the range of 2 μm to 12 μm, for example, 2 μm to 3 μm, 3 μm to 4 μm, 4 μm to 5 μm, 5 μm to 6 μm, 6 μm to 7 μm, 7 μm to 8 μm, 8 μm to 9 μm, 9 μm to 10 μm, 10 μm to 11 μm, or 11 μm to 12 μm. Optionally, the average width K1 of more than one line opening 632 is 4.5 μm, 5 μm, 5.2 μm, or 5.5 μm.

Optionally, the average gap width K2 of the first gap 63 is in the range of 2 μm to 12 μm, for example, 2 μm to 3 μm, 3 μm to 4 μm, 4 μm to 5 μm, 5 μm to 6 μm, 6 μm to 7 μm, 7 μm to 8 μm, 8 μm to 9 μm, 9 μm to 10 μm, 10 μm to 11 μm, or 11 μm to 12 μm. Optionally, the average gap width K2 of the first gap 63 is 4.5 μm, 5 μm, 5.2 μm, or 5.5 μm.

It should be noted that, the above values can also be set to different values according to different product requirements.

In some example embodiments, the touch detection lead wire 62 may include the first touch detection lead wire 621 and/or the second touch detection lead wire 622, that is, the touch detection lead wire 62 may include one of the first touch detection lead wire 621 or the second touch detection lead wire 622, and the touch detection lead wire 62 may include the first touch detection lead wire 621 and the second touch detection lead wire 622. The touch detection lead wire 62 can further include a first shielding wire 623, the first shielding wire 623 is directly adjacent to the touch detection electrode 61, and a first gap 63 is provided between the first shielding wire 623 and the touch detection electrode 61. The first gap 63 is able to insulate the first shielding wire 623 from the touch detection electrode 61. The specific structure of the first gap 63 has been described in detail above, so it will not be repeated here.

A second gap 64 is provided between the first shielding wire 623 and the first touch detection lead wire 621 or the second touch detection lead wire 622, and the second gap 64 is able to insulate the first shielding wire 623 from the first touch detection lead wire 621 or the second touch detection lead wire 622. The outline of the second gap 64 may include at least two second curves 641 connected in sequence, and the at least two second curves 641 have at least two different waveforms. Different waveforms can include triangular waves, semicircular waves, and trapezoidal waves, etc. As shown in FIG. 8 and FIG. 9, the two different waveforms can both be triangular waves, but the amplitudes and periods of the triangular waves are different. In addition, specifically, the outline of the second gap 64 may include two second curves 641, one of the second curves 641 may be a triangular wave, and the other one of the second curves 641 may be a trapezoidal wave. The outline of the second gap 64 may include more than one second curve 641, one of the second curves 641 may be a triangular wave, and the several other second curves 641 may be a trapezoidal wave. Outlines with different waveforms further enhance the blanking effect. The outline of the second gap 64 may also include more than one base line, and the base line may be connected between two adjacent second curves 641.

The second gap 64 may include more than one line opening 632, and the line opening 632 disconnects more than one grid line to form the first touch detection lead wire 621 or the second touch detection lead wire 622 and the first shielding wire 623. That is, it is the first touch detection lead wire 621 or the second touch detection lead wire 622 on a side of the line opening 632, and it is the first shielding wire 623 on the other side of the line opening 632. The second gap 64 is formed by connecting more than one line opening 632. The inclined directions of more than one line opening 632 are not on a same straight line, so that the outline of the second gap 64 formed by connecting more than one line opening 632 may include at least two second curved lines 641 connected in sequence.

Moreover, the orthographic projection of the line opening 632 on the base substrate 1 and the orthographic projection of the intersection part of the grid lines on the base substrate 1 do not overlap with each other, that is, the line opening 632 is not arranged at the position of the intersection part of the grid lines. Both the grid-shaped conductive part 6 and the line opening 632 are formed by metal layer etching to the entire layer setting, and the position of the intersection part is the position where more than one grind line is connected, that is, the cross-connected part of at least two grid lines forms the intersection part. If the line opening 632 is arranged at the position of the intersection part of the grid lines, in the case that there is one touch detection lead wire 62, it is easy to cause the touch detection lead wire 62 to form a broken line, resulting in an open circuit, and the requirement on etching precision is higher, leading to increased costs. By setting the line opening 632 away from the intersection part, it can be avoided that the touch detection lead wire 62 forms broken lines when there is one touch detection lead wire 62, ensuring the connection effect of the touch detection lead wire 62. Moreover, there is no high requirement on the etching precision, which will not lead to increased costs. In addition, the above structure and effect can be realized without too much modification to the existing mask.

Furthermore, the first gap 63 and the second gap 64 are parallel to each other, so that the width of the first shielding wire 623 formed between the first gap 63 and the second gap 64 is uniform, and will not be wide or narrow, so that the resistance at any position of the first shielded wire 623 is uniform.

In some example embodiments, in the case that the touch detection lead wire 62 may include a first touch detection lead wire 621 and a second touch detection lead wire 622, and the first touch detection lead wire 621 and the second touch detection lead wire 622 are arranged adjacent to each other, the touch detection lead wire 62 can further include a second shielding wire 624, and the second shielding wire 624 is arranged between the first touch detection lead wire 621 and the second touch detection lead wire 622, that is, the second shielding wire 624 is arranged between the first touch detection lead wire 621 and the second touch detection lead wire 622 indirectly adjacent to each other. A third gap 65 is provided both between the second shielding wire 624 and the first touch detection lead wire 621 and the second touch detection lead wire 622, that is, a third gap 65 is provided between the second shielding wire 624 and the first touch detection lead wire 621, and a third gap 65 is also provided between the second shielding wire 624 and the second touch detection lead wire 622. The third gaps 65 insulate the second shielding wire 624 both from the first touch detection lead wire 621 and the second touch detection lead wire 622.

The outline of the third gap 65 includes at least two third curves 651 connected in sequence, and the at least two third curves 651 have at least two different waveforms. Different waveforms can include triangular waves, semicircular waves, and trapezoidal waves, etc. As shown in FIG. 8 and FIG. 9, the two different waveforms can both be triangular waves, but the amplitudes and periods of the triangular waves are different. In addition, specifically, the outline of the third gap 65 may include two third curves 651, one of the third curves 651 may be a triangular wave, and the other one of the third curves 651 may be a trapezoidal wave. The outline of the third gap 65 may include more than one third curve 651, one of the third curves 651 may be a triangular wave, and the several other third curves 651 may be a trapezoidal wave. Outlines with different waveforms further enhance the blanking effect. The outline of the third gap 65 may also include more than one base line, and the base line may be connected between two adjacent third curves 651.

The third gap 65 may include more than one line opening 632 that disconnect more than one grid line to form the second shielding wire 624, the first touch detection lead wire 621 and the second touch detection lead wire 622. That is, it is the first touch detection lead wire 621 or the second touch detection lead wire 622 on a side of the line opening 632, and it is the second shielding wire 624 on the other side of the line opening 632. The third gap 65 is formed by connecting more than one line opening 632. The inclined directions of more than one line opening 632 are not on a same straight line, so that the outline of the third gap 65 formed by connecting more than one line opening 632 may include at least two third curves 651 connected in sequence.

Moreover, the orthographic projection of the line opening 632 on the base substrate 1 and the orthographic projection of the intersection part of the grid lines on the base substrate 1 do not overlap with each other, that is, the line opening 632 is not arranged at the position of the intersection part of the grid lines. Both the grid-shaped conductive part 6 and the line opening 632 are formed by metal layer etching to the entire layer setting, and the position of the intersection part is the position where more than one wire is connected. If the line opening 632 is arranged at the position of the intersection part of the grid lines, in the case that there is one touch detection lead wire 62, it is easy to cause the touch detection lead wire 62 to form a broken line, resulting in an open circuit, and the requirement on etching precision is higher, leading to increased costs. By setting the line opening 632 away from the intersection part, it can be avoided that the touch detection lead wire 62 forms broken lines when there is one touch detection lead wire 62, ensuring the connection effect of the touch detection lead wire 62. Moreover, there is no high requirement on the etching precision, which will not lead to increased costs. In addition, the above structure and effect can be realized without too much modification to the existing mask.

There may be more than one first touch detection lead wire 621, and a fourth gap 66 is provided between two adjacent first touch detection lead wires 621. The fourth gap 66 insulates two adjacent first touch detection lead wires 621 from each other. There may be more than one second touch detection lead wire 622, and a fifth gap 67 is provided between two adjacent second touch detection lead wires 622, and the fifth gap 67 insulates two adjacent second touch detection lead wires 622 from each other.

The outline of the fourth gap 66 can include at least two fourth curves 661 connected in sequence, and the at least two fourth curves 661 have at least two different waveforms. The outline of the fifth gap 67 can include at least two fifth curves 671 connected in sequence, and the at least two fifth curves 671 have at least two different waveforms.

Different waveforms can include triangular waves, semicircular waves, and trapezoidal waves, etc. As shown in FIG. 8 and FIG. 9, the two different waveforms can both be triangular waves, but the amplitudes and periods of the triangular waves are different. In addition, specifically, the outline of the fourth gap 66 may include two fourth curves 661, one of the fourth curves 661 may be a triangular wave, and the other fourth curve 661 may be a trapezoidal wave. The outline of the fourth gap 66 may include more than one fourth curve 661, one of the fourth curves 661 may be a triangular wave, and the several other fourth curves 661 may be a trapezoidal wave. Outlines with different waveforms further enhance the blanking effect. The outline of the fourth gap 66 may also include more than one base line, and the base lines may be connected between two adjacent fourth curves 661. The outline of the fifth gap 67 may include two fifth curves 671, one of the fifth curves 671 may be a triangular wave, and the other fifth curve 671 may be a trapezoidal wave. The outline of the fifth gap 67 may include more than one fifth curve 671, one of the fifth curves 671 may be a triangular wave, and the several other fifth curves 671 may be a trapezoidal wave. Outlines with different waveforms further enhance the blanking effect. The outline of the fifth gap 67 may also include more than one base line, and the base line may be connected between two adjacent fifth curves 671.

Both the fourth gap 66 and the fifth gap 67 may include more than one line opening 632, and the line opening 632 disconnect more than one grid line to form the first touch detection lead wire 621 and the second touch detection lead wire 622. That is, it is the first touch detection lead wire 621 or the second touch detection lead wire 622 on a side of the line opening 632, and it is the first touch detection lead wire 621 or the second touch detection lead wire 622 on the other side of the line opening 632. The fourth gap 66 and the fifth gap 67 are formed by connecting more than one line opening 632. The inclination directions of more than one line opening 632 are not on A same straight line, so that the fourth gap 66 formed by the connecting more than one line opening 632 may include at least two fourth curves 661 connected in sequence, and the fifth gap 67 formed by the connecting of more than one line opening 632 may include at least two fifth curves 671 connected in sequence.

Moreover, the orthographic projection of the line opening 632 on the base substrate 1 and the orthographic projection of the intersection part of the grid lines on the base substrate 1 do not overlap with each other, that is, the line opening 632 is arranged at the position of the intersection part of the grid lines. Both the grid-shaped conductive part 6 and the line opening 632 are formed by metal layer etching to the entire layer setting, and the position of the intersection part is the position where more than one wire is connected. If the line opening 632 is arranged at the position of the intersection part of the grid lines, in the case that there is one first touch detection lead wire 621 and second touch detection lead wire 622, it is easy to cause the first touch detection lead wire 621 and the second touch detection lead wire 622 to form broken lines, resulting in an open circuit, and the requirement on etching precision is higher, leading to increased costs. By setting the line opening 632 away from the intersection part, it can be avoided that the first touch detection lead wire 621 and the second touch detection lead wire 622 form broken lines when there is one first touch detection lead wire 621 and second touch detection lead wire 622, ensuring the connection effect of the first touch detection lead wire 621 and the second touch detection lead wire 622. Moreover, there is no high requirement on the etching precision, which will not lead to increased costs. In addition, the above structure and effect can be realized without too much modification to the existing mask.

The second gap 64 and the third gap 65 are parallel to each other. The fourth gap 66, the fifth gap 67 are both parallel to the third gap 65. The width of the first touch detection lead wire 621 or the second touch detection lead wire 622 formed between the third gap 65 and the second gap 64 is uniform, and will not be wide or narrow, so that the resistance at any position of the first touch detection lead wire 621 or the second touch detection lead wire 622 is uniform. The width of the first touch detection lead wire 621 formed between the third gap 65 and the fourth gap 66 and between two fourth gaps 66 is uniform, and will not be wide or narrow, so that the resistance at any position of the first touch detection lead wire 621 is uniform. The width of the second touch detection lead wire 622 formed between the third gap 65 and the fifth gap 67 and between two fifth gaps 67 is uniform, and will not be wide or narrow, so that the resistance at any position of the second touch detection lead wire 622 is uniform.

It should be noted that different waveforms not refer to different shapes of waves, but also different amplitudes and/or periods of waves with the same shape; and the first curve, the second curve, the third curve, the fourth curve and the fifth curve can not only be formed by connecting arcs, but also can be formed by connecting straight lines, or can be formed by connecting straight lines and arcs.

Figure 13:
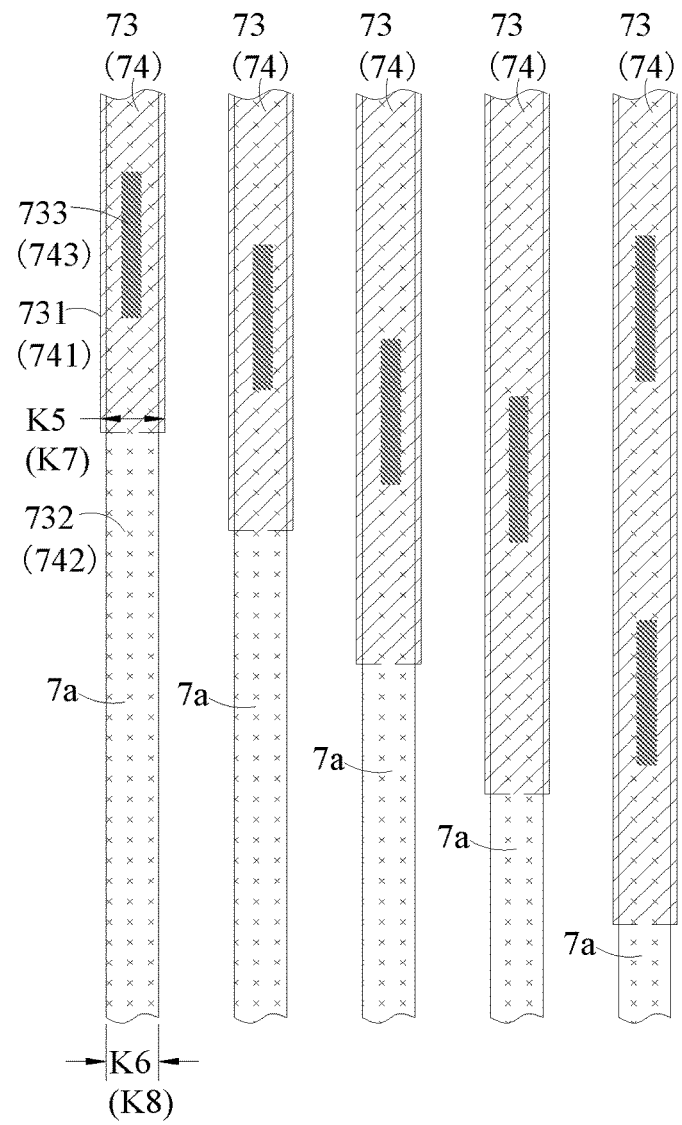
FIG. 13 is a schematic structural diagram of peripheral touch detection lead wires in the display panel of the present disclosure.

Referring to FIG. 6, FIG. 7 and FIG. 13, the display panel may further include peripheral touch detection lead wires 7, which are arranged in the peripheral region ZW, and a part of partial peripheral touch detection lead wires 7 is arranged as a single-layer structure 7a.

Specifically, the peripheral touch detection lead wire 7 may include a third peripheral detection lead wire 73, a fourth peripheral detection lead wire 74, and a first peripheral detection lead wire 71 or a second peripheral detection lead wire 72. The peripheral touch detection lead wire 7 may also include a third peripheral detection lead wire 73, a fourth peripheral detection lead wire 74, a first peripheral detection lead wire 71 and a second peripheral detection lead wire 72.

The first peripheral detection lead wire 71 is connected to the first touch detection lead wire 621, and the second peripheral detection lead wire 72 is connected to the second touch detection lead wire 622. The first peripheral detection lead wire 71 is arranged as a double-layer structure, that is, the first layer of the first peripheral detection lead wire 71 is arranged on the first touch metal layer 51, and the second layer of the first peripheral detection lead wire 71 is arranged on the second touch metal layer 53, and the first layer and the second layer are connected as a whole through the via provided on the touch insulation layer 52. The second peripheral detection lead wire 72 is arranged as a double-layer structure, that is, the third layer of the second peripheral detection lead wire 72 is arranged on the first touch metal layer 51, and the fourth layer of the second peripheral detection lead wire 72 is arranged on the second touch metal layer 53, and the third layer and the fourth layer are connected as a whole through the via provided on the touch insulation layer 52.

Both the first touch detection lead wire 621 and the second touch detection lead wire 622 are arranged as a single-layer structure 7a, that is, the first touch detection lead wire 621 and the second touch detection lead wire 622 can be arranged on the first touch metal layer 51 or on the second touch metal layer 53. Moreover, the width of the first touch detection lead wire 621 and the width of the second touch detection lead wire 622 are narrower than the width of the third peripheral detection lead wire 73 and the width of the fourth peripheral detection lead wire 74.

Figure 14:
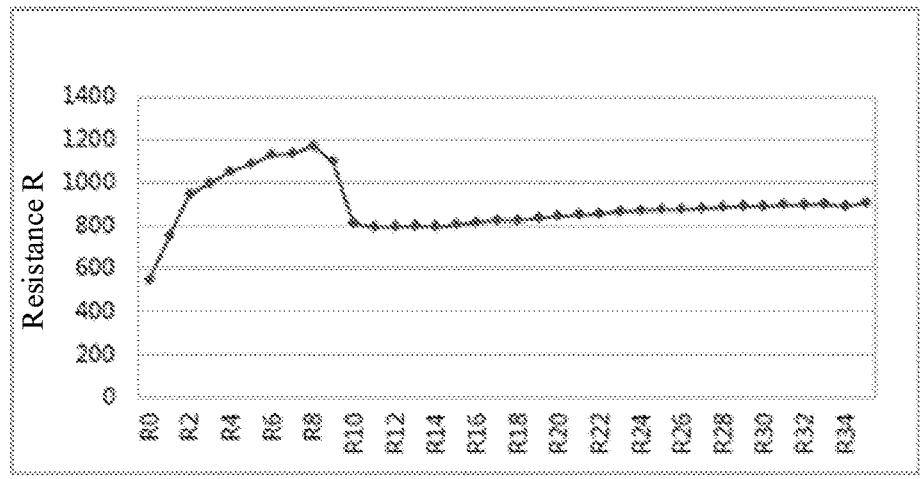
FIG. 14 is a schematic diagram of resistance curves of different touch leads in the display panel of the present disclosure.

The first touch detection lead wire 621 is connected with the first peripheral detection lead wire 71 to form a driving detection lead wire or sensing detection lead wire, and the second peripheral detection lead wire 72 is connected with the second touch detection lead wire 622 to also form a driving detection lead wire or sensing detection lead wire. Due to the above reasons, it is resulted in that the resistance of the formed driving detection lead wire or sensing detection lead wire is relatively large. As shown in FIG. 14, R0-R9 are the resistances of the touch lead wires formed by connecting the first touch detection lead wire 621 and the first peripheral detection lead wire 71 or by connecting the second peripheral detection lead wire 72 and the second touch detection lead wire 622. R10-R36 are the resistances of the third peripheral detection lead wires 73 or the fourth peripheral detection lead wires 74. It can be obtained from the drawing that the resistance difference between R9 and R10 is large, so that there will be a jump, which will affect the touch performance, resulting in differences in the capacitance values of different channels, and the problem of uneven capacitance values.

In order to solve the above-mentioned problem, as shown in FIG. 12, a part of partial peripheral touch detection lead wire 7 is provided as a single-layer structure 7a.

Specifically, a part of the third peripheral detection lead wire 73 connected with the touch detection electrode 61 is provided as a single-layer structure 7a, and a part of the fourth peripheral detection lead wire 74 connected with the touch detection electrode 61 is provided as a single-layer structure 7a, so as to increase the resistance of the third peripheral detection lead wire 73 and the resistance of the fourth peripheral detection lead wire 74.

It may be that the sum of the resistance of the first peripheral detection lead wire 71 and the resistance of the first touch detection lead wire 621 is equal to the resistance of the third peripheral detection lead wire 73. However, there is always a certain error in the preparation process, therefore, the difference between the sum of the resistance of the first peripheral detection lead wire 71 and the resistance of the first touch detection lead wire 621 and the resistance of the third peripheral detection lead wire 73 may be less than or equal to 10% of the resistance of the third peripheral detection lead wire 73, for example, it may be less than or equal to 8%, 7%, 5.5%, 3%, 2%, 1%, etc. of the resistance of the third peripheral sense lead 73. The first peripheral detection lead wire 71 and the third peripheral detection lead wire 73 are connected to different touch electrodes of the same touch unit, for example, they can be connected to the first touch unit 611 or the second touch unit 612 at the same time. In the case of being connected to the touch driving unit, the first peripheral detection lead wire 71 and the third peripheral detection lead wire 73 are touch driving lead wires. In the case of being connected to the touch sensing unit, the first peripheral detection lead wire 71 and the third peripheral detection lead wire 73 are touch sensing lead wires.

It may be that the sum of the resistance of the second peripheral detection lead wire 72 and the resistance of the second touch detection lead wire 622 is equal to the resistance of the fourth peripheral detection lead wire 74. However, there is always a certain error in the preparation process, therefore, the difference between the sum of the resistance of the second peripheral detection lead wire 72 and the resistance of the second touch detection lead wire 622 and the resistance of the fourth peripheral detection lead wire 74 may be less than or equal to 10% of the resistance of the fourth peripheral detection lead wire 74, for example, it may be less than or equal to 8%, 7%, 5.5%, 3%, 2%, 1%, etc. of the resistance of the fourth peripheral sense lead 74. The second peripheral detection lead wire 72 and the fourth peripheral detection lead wire 74 are connected to different touch electrodes of the same touch unit, for example, they can be connected to the first touch unit 611 or the second touch unit 612 at the same time. In the case of being connected to the touch driving unit, the second peripheral detection lead wire 72 and the fourth peripheral detection lead wire 74 are touch driving lead wires, and in the case of being connected the touch sensing unit, the second peripheral detection lead wire 72 and the fourth peripheral detection lead wire 74 are touch sensing lead wires.

Since the farther away from the display region AA, the longer the lead wire is, and the greater the resistance is. Therefore, the length of the single-layer structure 7a of the third peripheral detection lead wire 73 is set to decrease as the distance from the display region AA in the first direction X increases, the length of the single-layer structure 7a of the fourth peripheral detection lead wire 74 is set to decrease as the distance from the display region AA in the first direction X increases, and the resistance of the third peripheral detection lead wire 73 and the resistance of the fourth peripheral detection lead wire 74 on the outside can be reduced, so that all the resistance of the third peripheral detection lead wires 73 and the resistance of the fourth peripheral detection lead wires 74 tend to be the same, ensuring a uniform touch effect.

Furthermore, the start position of the single-layer structure 7a of the third peripheral detection lead wire 73 may be on a straight line with the start position of the first touch detection lead wire 621, and the straight line is parallel to the edge of the display region AA close to the bonding region BOD. The start position of the single-layer structure 7a of the fourth peripheral detection lead wire 74 can be on a straight line with the start position of the second touch detection lead wire 622, and the straight line is parallel to the edge of the display region AA close to the bonding region BOD. It is convenient to calculate and design the resistance of the third peripheral detection lead wire 73 and the fourth peripheral detection lead wire 74.

The end position of the single-layer structure 7a of the third peripheral detection lead wire 73 and the end position of the single-layer structure 7a of the fourth peripheral detection lead wire 74 can be designed according to the desired resistance value.

It should be noted that the parallel and perpendicular in the description are not completely parallel and perpendicular, but have a certain range. For example, two lines being parallel can mean that the angle between the two lines is less than or equal to 10°, and two lines being perpendicular may be that the angle between the two lines is between 85° and 95°.

In addition, the resistance value of the third peripheral detection lead wire 73 and the fourth peripheral detection lead wire 74 can be adjusted by adjusting the width of them. Specifically, a part of the third peripheral detection lead wire 73 is arranged as a double-layer structure, that is, the first layer 731 of the third peripheral detection lead wire 73 is arranged on the first touch metal layer 51, and the second layer 732 of the third peripheral detection lead wire 73 is arranged on the second touch metal layer 53. The first layer 731 and the second layer 732 are connected as a whole through the eighth via hole 733 provided on the touch insulation layer 52, and the width K6 of the second layer 732 is less than the width K5 of the first layer 731. It may also be that the width of a part of the second layer 732 is less than the width of the first layer 731, or the width of the first layer 731 may be less than the width of the second layer 732.

It is also possible to set the width of at least a part of the third peripheral detection lead wire 73 to be equal to or less than the width of the touch detection lead wire 62, for example, the width of at least a part of the third peripheral detection lead wire 73 is set to be equal to or less than the width of the first touch detection lead wire 621. Since the resistance is mainly adjusted, the width of the first touch detection lead wire 621 refers to the sum of the widths of the grid lines of the first touch detection lead wire 621 in its width direction. The width of the third peripheral detection lead wire 73 may be greater than the width of the touch detection lead wire 62, in this case, the resistance is adjusted by the length of the above-mentioned single-layer structure.

A part of the fourth peripheral detection lead wire 74 is arranged as a double-layer structure, that is, the third layer 741 of the fourth peripheral detection lead wire 74 is arranged on the first touch metal layer 51, and the fourth layer 742 of the fourth peripheral detection lead wire 74 is arranged on the second touch metal layers 53, and the third layer 741 and the fourth layer 742 are connected as a whole through the ninth via hole 743 provided on the touch insulation layer 52. The width K8 of the fourth layer 742 is less than the width K7 of the third layer 741. The width of a part of the fourth layer 742 may be less than the width of the third layer 741, or the width of the third layer 741 may be less than the width of the fourth layer 742.

It is also possible to set the width of at least a part of the fourth peripheral detection lead wire 74 to be equal to or less than the width of the touch detection lead wire 62, for example, the width of at least a part of the fourth peripheral detection lead wire 74 is set to be equal to or less than the width the second touch detection lead wire 622. Since the resistance is mainly adjusted, the width of the second touch detection lead wire 622 refers to the sum of the widths of the grid lines the first touch detection lead wire 621 in its width direction. The width of the fourth peripheral detection lead wire 74 may be greater than the width of the touch detection lead wire 62, in this case, the resistance is adjusted by the length of the above-mentioned single-layer structure.

In some example embodiments, as shown in FIG. 6 and FIG. 7, the display panel may be a flexible display panel with curved surfaces on four sides. Therefore, the display panel has a bending line L1, and the bending line L1 is located in the display region AA. The part of the display panel located outside the bending line L1 can be bent to form a curved surface, and the touch detection lead wire 62 is located on a side of the bending line L1 close to the peripheral region ZB.

Since the touch detection electrode 61 cannot be arranged at the position where the touch detection lead wire 62 is arranged, therefore, the touch function cannot be realized at the position where the touch detection lead wire 62 is arranged. The touch detection lead wire 62 is arranged on the side of the bending wire L1 close to the peripheral region ZB, so as to ensure that the display panel has a touch function in a plane region. A part of the touch detection lead wire 62 may be provided on the side of the bending wire L1 away from the peripheral region ZB.

In other example embodiments, a notch is provided on the edge of the touch detection electrode 61, and a camera can be arranged on the side of the display panel away from the display surface. The lighting surface of the camera is close to the display panel. The notch can be arranged opposite to the camera. The impact of the metal grid on the lighting of the camera can be avoided by setting a notch. The touch detection lead wire 62 may be located on the side of the notch away from the peripheral region ZW, that is, the touch detection lead wire 62 may be arranged on the side of the notch away from the edge of the peripheral region ZW.

Figure 15:
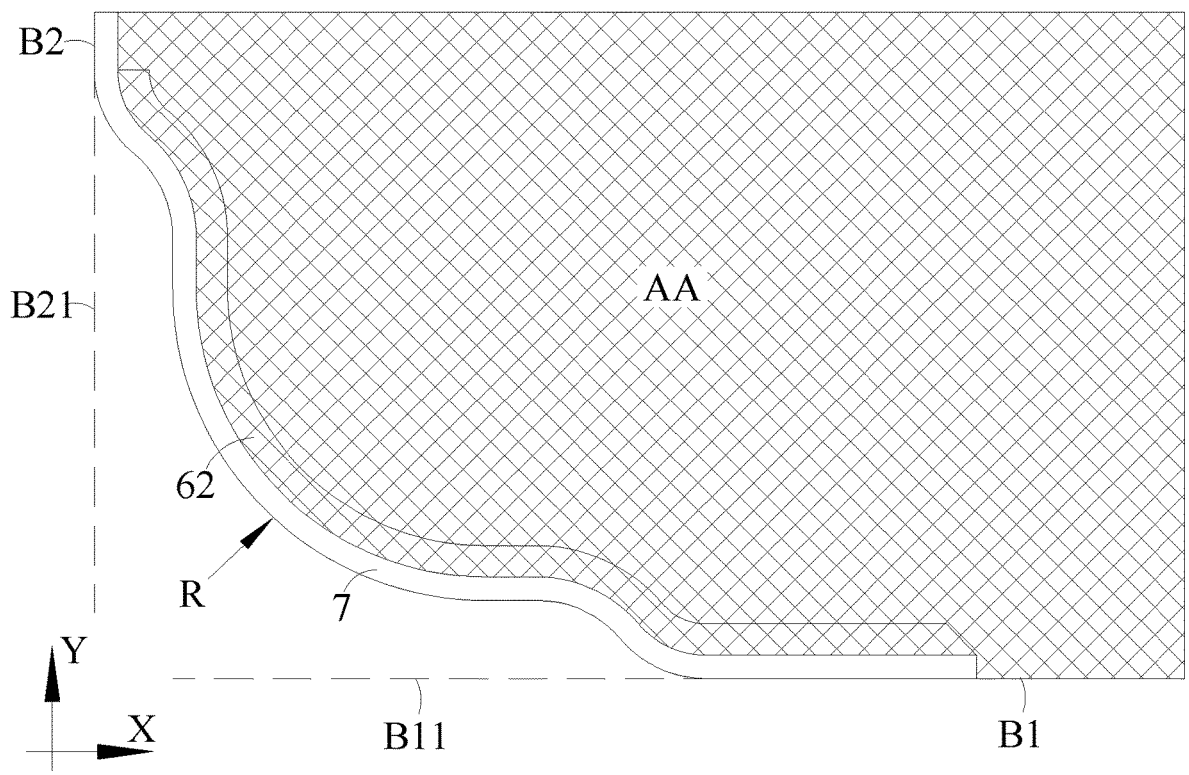
FIG. 15 is a schematic diagram of a partial structure of a corner of the display panel of the present disclosure.
Figure 16:
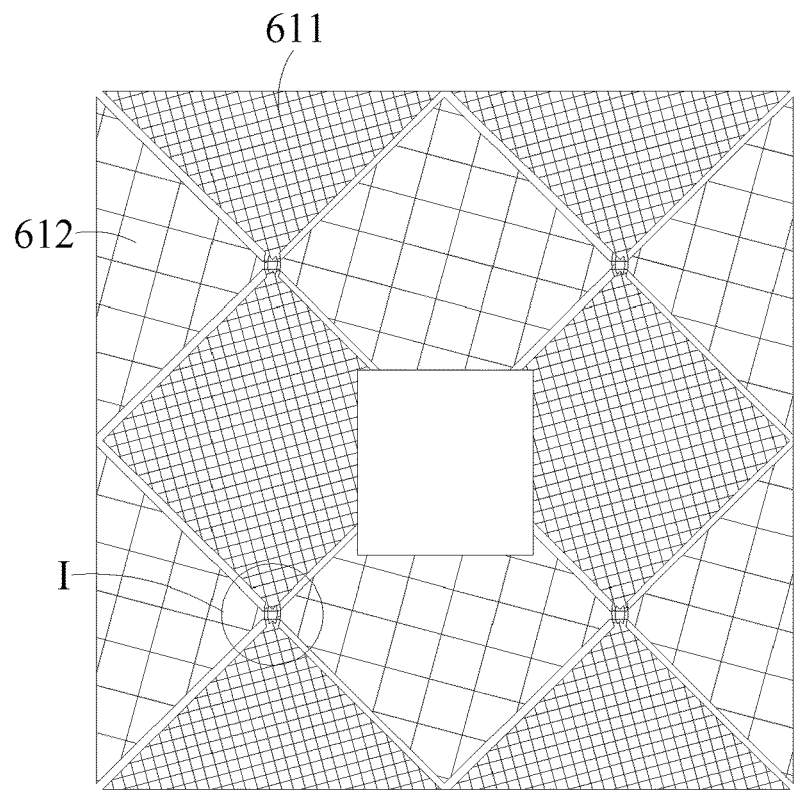
FIG. 16 is a schematic structural diagram of the position of the display panel provided with a via hole of the present disclosure.

In some example embodiments, as shown in FIG. 15, the corner part of the display panel is provided with a rounded chamfer R, and the two ends of the rounded chamfer R are connected smoothly with a first edge line B1 and a second edge line B2 correspondingly. The rounded chamfer R can be connected with the first edge line B1 and the second edge line B2 through more than one arc and straight line to form a smooth connection structure. The first edge line B1 extends along the first direction X, the second edge line B2 extends along the second direction Y, and the first direction X intersects with the second direction Y. For example, the first direction X is perpendicular to the second direction Y. The rounded chamfer R is located on the side of the first extension line B11 of the first edge line B1 close to the display region, and is located on the side of the second extended line B21 of the second edge line B2 close to the display region. There is a non-zero distance between rounded chamfer R and the first extension line B11 of the edge line B1, and there is a non-zero distance between rounded chamfer R and the second extension line B21 of the second edge line B2, so that the rounded chamfer R forms a retracted structure relative to the first edge line B1 and the second edge line B1. The display panel can be applied to a structure in which four sides are bent to form a curved surface.

The start position of the touch detection lead wire 62 may be located on the side of the rounded chamfer R away from the second extension line B21, and the end position of the touch detection lead wire 62 may be located on the side of the rounded chamfer R close to the second extension line B21. Specifically, the end position of the touch detection lead wires 62 is aligned with the end of the second edge line B2 close to the rounded chamfer R in the second direction Y, so that the touch detection lead wires 62 are all arranged in the display region AA at the rounded chamfer R of the display panel.

In some example embodiments, as shown in FIG. 16-FIG. 20, the display panel can be provided with an under-screen camera, and a via hole 613 can be provided on the touch detection electrode 61. Therefore, it is a light transmitting display region in the via hole 613. A camera can be arranged on the side of the display panel far away from the display surface, and the lighting surface of the camera is close to the display panel. The via hole 613 can be arranged opposite to the camera. By setting the via hole 613, the impact of the metal grid on the lighting of the camera can be avoided. The area of the orthographic projection of the via hole 613 on the base substrate 1 is greater than the area of the orthographic projection of the grid on the base substrate 1. The area of the orthographic projection of the via hole 613 on the base substrate 1 can be several times of the area of the orthographic projection of the grid on the substrate 1, and the area of the orthographic projection of the via hole 613 on the base substrate 1 is greater than or equal to the area of the lighting surface of the camera.

The via hole 613 penetrates through the first touch unit 611 and the second touch unit 612, and the orthographic projection of the via hole 613 on the base substrate 1 and the orthographic projection of the first connection part 6112 on the base substrate 1 do not overlap with the orthographic projection of the second connection part 6122 on the base substrate 1, that is, the via hole 613 does not penetrate through the first connection part 6112 and the second connection part 6122.

Figure 17:
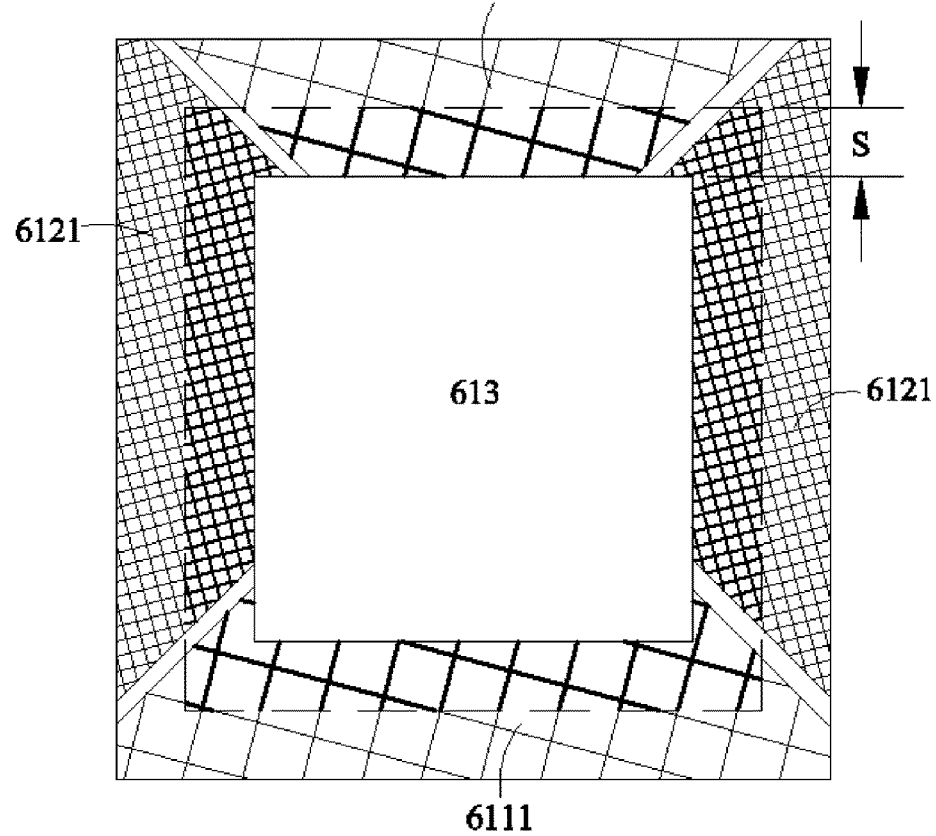
FIG. 17 is a schematic structural diagram of the grid lines around the via hole in FIG. 16 after being thickened.

When the touch detection electrode 61 is etched to form the via hole 613, due to the problem of etching precision, the grid lines of the touch detection electrode 61 around the via hole 613 will inevitably be etched, resulting in that the grid lines of the touch detection electrode 61 around the via hole 613 are too thin, which is prone to disconnection. Referring to FIG. 17, the width of the grid lines of the touch detection electrodes 61 in the region adjacent to the via hole 613 is designed to be wider than the width of the grid lines of the rest part. Even if the grid lines of the touch detection electrode 61 around the via hole 613 are etched, the width of the grid lines of the touch detection electrode 61 adjacent to the via hole 613 in the final formed product is greater than or equal to the width of the grid lines of the rest part. The width S of the region is greater than or equal to 0.5 mm and less than or equal to 1 mm.

Figure 18:
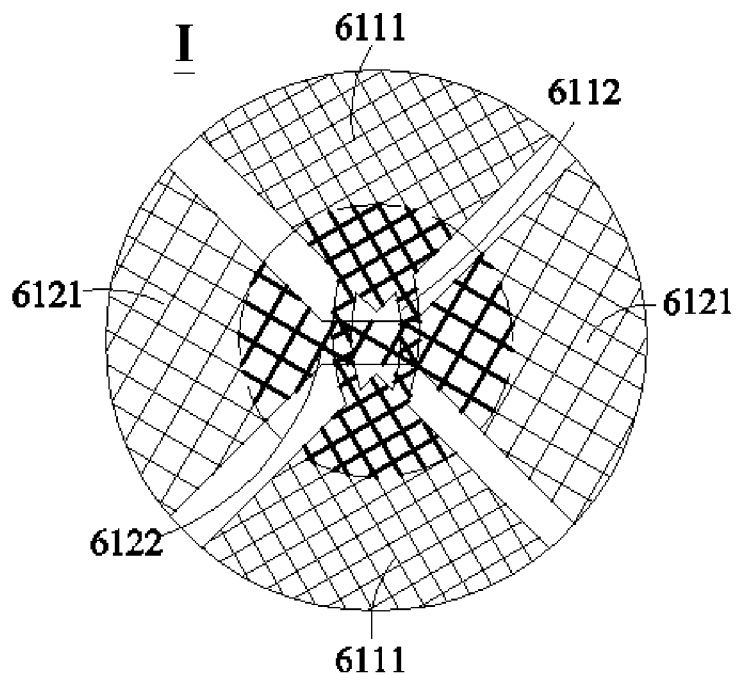
FIG. 18 is a schematic diagram of a partially enlarged structure of the part indicated by I in FIG. 16.

In some other example embodiments, as shown in FIG. 18, since the first connection part 6112 plays the role of connecting two adjacent first touch electrodes 6111, the second connection part 6122 plays the role of connecting two adjacent second touch electrodes 6121, and the widths of the first connection part 6112 and the second connection part 6122 are originally set to be small, that is, the number of grids included in the first connection part 6112 and the second connection part 6122 is small, thus, the first connection part 6112 and the second connection part 6122 are more likely to be etched and disconnected when being etched to form the via hole 613, and the disconnection of the first connection part 6112 and the second connection part 6122 will cause the corresponding first touch control unit 611 and the second touch unit 612 cannot implement the touch function.

The width of the grid lines of the first connection part 6112 adjacent to the via hole 613 can be designed to be greater than the width of the grid lines of the rest part, and the width of the grid lines of the second connection part 6122 adjacent to the via hole 613 can be designed to be greater than the width of the grid lines of the rest part. Even if the grid lines of the first connection part 6112 and the grid lines of the second connection part 6122 adjacent to the via hole 613 are etched, the width of the gridlines of the first connection part 6112 adjacent to the via hole 613 in the final product is greater than or equal to the width of the grid lines of the rest part, and the width of the grid lines of the second connection part 6122 adjacent to the via hole 613 is greater than or equal to the width of the grid lines of the rest part, so as to prevent the first connection part 6112 and the second connection part 6122 from being etched and disconnected, and ensure the touch performance of the touch detection electrode 61.

Figure 19:
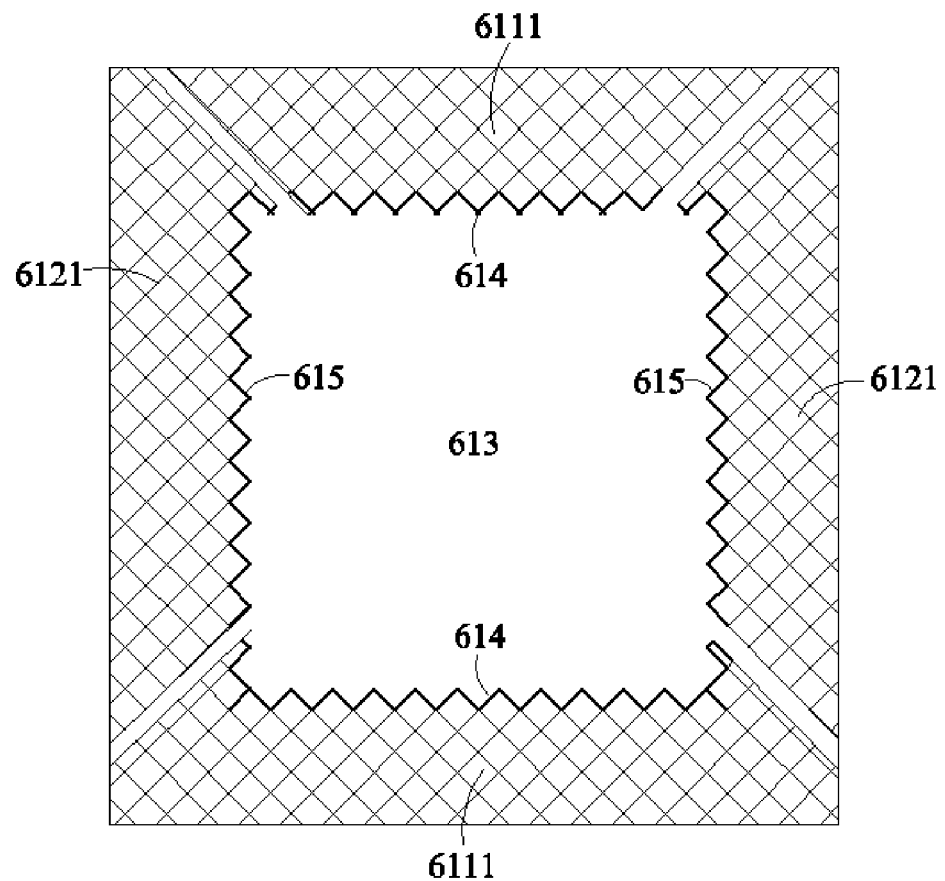
FIG. 19 is a schematic structural diagram of some embodiments of arranging first connection wires and second connection wires around the via hole in FIG. 16.
Figure 20:
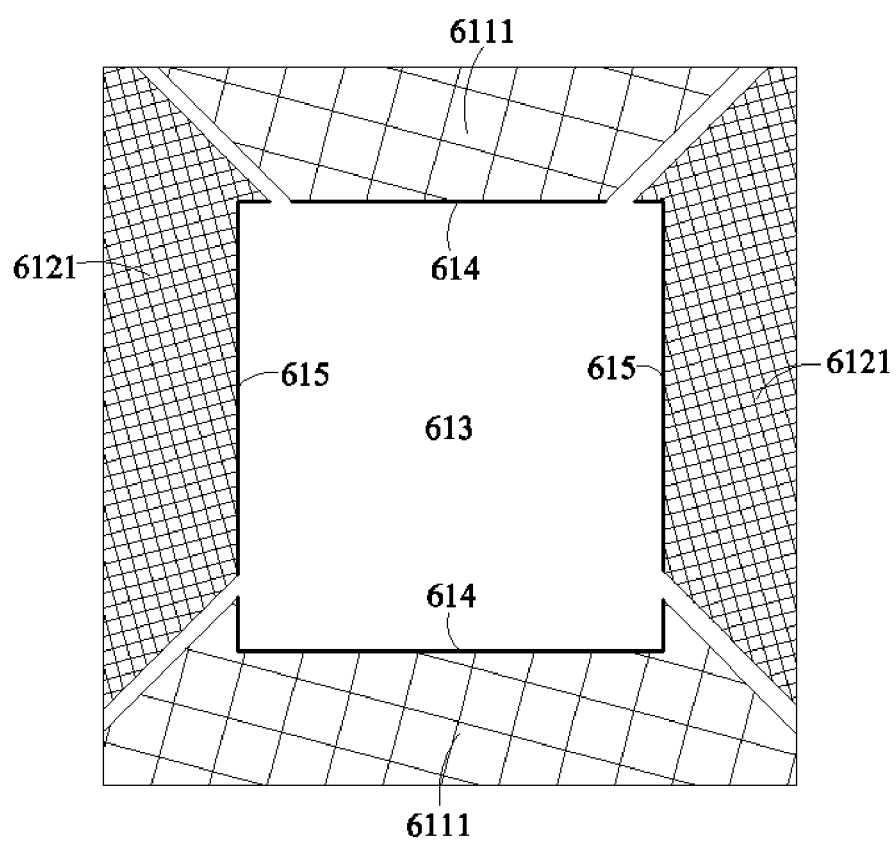
FIG. 20 is a schematic structural diagram of some other embodiments of arranging the first connection wire and the second connection wire around the via hole in FIG. 16.

In some example embodiments, as shown in FIG. 19 and FIG. 20, the touch detection electrode 61 may further include a first connection wire 614 and a second connection wire 615. In the embodiment, since two first touch electrodes 6111 and two second touch electrodes 6121 are formed along the edge of the via hole, therefore, two first connection wires 614 and two second connection wires 615 are provided. A first connection wire 614 is arranged on the edge of the via hole 613 and connected with a first touch electrode 6111; a second connection wire 615 is arranged on the edge of the via hole 613 and connected with a second touch electrode 6121. In other example embodiments of the present disclosure, the numbers of the first connection wires 614 and the second connection wires 615 may be determined according to the connected first touch electrodes 6111 and second touch electrodes 6121.

Referring to FIG. 19, the edge of the via hole 613 can be provided at the position of the intersection part of the grid lines. Then, after the via hole 613 is formed by etching, the edge of the via hole 613 is formed with the first connection wire 614 and the second connection wire 615. The width of the first connection wire 614 can be designed to be greater than the width of the grid lines of the first touch unit 611, and the width of the second connection wire 615 can be designed to be greater than the width of the grid lines of the second touch unit 612. Even if the first connection wire 614 and the second connection wire 615 are etched, the width of the first connection wire 614 in the final product is greater than or equal to the width of the grid lines of the first touch unit 611, and the width of the second connection wire 615 is greater than or equal to the width of the grid lines of the second touch unit 612, avoiding the disconnection of the first connection wire 614 and the second connection wire 615, ensuring the touch function of the touch detection electrode 61, and avoiding that the touch detection electrode 61 has a floating defect at the edge of the via hole 613.

Referring to FIG. 20, the edge of the via hole 613 can be provided on the grid line. Then, after the via hole 613 is formed by etching, free ends of more than one disconnected grid line are formed on the edge of the via hole 613. The free ends of more than one disconnected grid line corresponding to the touch electrode can be connected as a whole by designing the first connection wires 614 and the second connection wires 615, so as to prevent the touch detection electrode 61 from having floating defect on the edge of the via holes 613.

Similarly, the width of the first connection wire 614 can be designed to be greater than the width of the grid lines of the first touch unit 611, and the width of the second connection wire 615 can be designed to be greater than the width of the grid lines of the second touch unit 612. Even if the first connection wire 614 and the second connection wire 615 are etched, the width of the first connection wire 614 in the final product is greater than or equal to the width of the grid lines of the first touch unit 611, and the width of the second connection wire 615 is greater than or equal to the width of the grid lines of the second touch unit 612, so as to avoid disconnection of the first connection wire 614 and the second connection wire 615 and ensure the touch function of the touch detection electrode 61.

Those skilled in the art will easily think of other embodiments of the present disclosure after considering the description and practicing the present disclosure disclosed here. The present disclosure is intended to cover any variant, uses or adaptive change of the present disclosure. These variants, uses or adaptive changes follow the general principles of the present disclosure and include the common knowledge or commonly used technical means in the technical field not disclosed in the present disclosure. The description and embodiments are only regarded as illustrative. The true scope and spirit of the disclosure are indicated by the appended claims.

What is claimed is:

1. A display panel, comprising a display region and a peripheral region arranged around the display region, wherein the display panel comprises:
   a base substrate;
   a grid-shaped conductive part, arranged on a side of the base substrate and located in the display region, wherein the grid-shaped conductive part comprises:
   a touch detection electrode;
   a touch detection lead wire, arranged on a side of the touch detection electrode close to the peripheral region, and at least partially located in the display region; wherein a first gap is provided between an orthographic projection of the touch detection lead wire on the base substrate and an orthographic projection of the touch detection electrode on the base substrate, and an outline of the first gap comprises at least two first curves connected in sequence.

2. The display panel according to claim 1, wherein the at least two first curves are provided with at least two different waveforms, and the at least two first curves are alternately connected to form the first gap.

3. The display panel according to claim 1, wherein the first gap comprises more than one line opening, wherein the line opening disconnects more than one grid line of the grid-shaped conductive part to form the touch detection electrode and the touch detection lead wire, and inclination directions of the more than one the line opening are not on a same straight line; and a cross-connected part of at least two grid lines forms an intersection part, and an orthographic projection of the line opening on the base substrate and an orthographic projection of the intersection part of the grid line on the base substrate do not overlap with each other.

4. The display panel according to claim 1, wherein the touch detection lead wire comprises:

a first touch detection lead wire and/or the second touch detection lead wire; and a first shielding wire, adjacent to and arranged at intervals with the touch detection electrode, wherein the first gap is provided between the first shielding wire and the touch detection electrode, a second gap is provided between the first shielding wire and the first touch detection lead wire or the second touch detection lead wire, an outline of the second gap comprises at least two second curves connected in sequence, and the at least two second curves are provided with at least two different waveforms;

wherein the first gap and the second gap are parallel to each other.

5. The display panel according to claim 4, wherein first touch detection lead wire is arranged adjacent to the second touch detection lead wire, and the touch detection lead wire further comprises:

a second shielding wire, arranged between the first touch detection lead wire and the second touch detection lead wire, wherein a third gap is provided both between the second shielding wire and the first touch detection lead wire and the second touch detection lead wire, an outline of the third gap comprises at least two third curves connected in sequence, and the at least two third curves are provided with at least two different waveforms;

wherein the second gap and the third gap are parallel to each other.

6. The display panel according to claim 5, wherein more than one first touch detection lead wire is provided, a fourth gap is provided between two adjacent first touch detection lead wires, an outline of the fourth gap comprises at least two fourth curves connected in sequence, and the at least two fourth curves are provided with at least two different waveforms; more than one second touch detection lead wire is provided, a fifth gap is provided between two adjacent second touch detection lead wires, an outline of the fifth gap comprises at least two fifth curves connected in sequence, and the at least two fifth curves are provided with at least two different waveforms; the fourth gap, the fifth gap and the third gap are parallel to each other.

7. The display panel according to claim 4, wherein the display panel further comprises:

a peripheral touch detection lead wire, arranged in the peripheral region, wherein a part of the peripheral touch detection lead wire is arranged as a single-layer structure;

wherein the peripheral touch detection lead wire comprises:

a first peripheral detection lead wire and/or a second peripheral detection lead wire. wherein the first peripheral detection lead wire is connected to the first touch detection lead wire, and the second peripheral detection lead wire is connected to the second touch detection lead wire;

a third peripheral detection lead wire, connected to the touch detection electrode, wherein a part of the third peripheral detection lead wire is arranged as a single-layer structure; and a fourth peripheral detection lead wire, connected to the touch detection electrode, wherein a part of the fourth peripheral detection lead wire is arranged as a single-layer structure.

8. The display panel according to claim 7, wherein a difference between a sum of a resistance of the first peripheral detection lead wire and a resistance of the first touch detection lead wire and a resistance of the third peripheral detection lead wire is less than or equal to 10% of the resistance of the third peripheral detection lead wire, and the first peripheral detection lead wire and the third peripheral detection lead wire are connected to a same touch unit; and a difference between a sum of a resistance of the second peripheral detection lead wire and a resistance of the second touch detection lead wire and a resistance of the fourth peripheral detection lead wire is less than or equal to 10% of the resistance of the fourth peripheral detection lead wire, and the second peripheral detection lead wire and the fourth peripheral detection lead wire are connected to a same touch unit.

9. The display panel according to claim 7, wherein a length of the single-layer structure of the third peripheral detection lead wire decreases as a distance from the display region increases, and a length of the single layer structure of the fourth peripheral detection lead wire decreases as a distance from the display region increases.

10. The display panel according to claim 7, wherein a start position of the single-layer structure of the third peripheral detection lead wire is on a first straight line with a start position of the first touch detection lead wire; the first straight line is parallel to an edge of the display region close to a bonding region; the first peripheral detection lead wire and the third peripheral detection lead wire are connected to different touch electrodes of a same touch unit; the first touch detection lead wire is located on a side of the third peripheral detection lead wire close to the display region; a start position of the single-layer structure of the fourth peripheral detection lead wire is on a second straight line with a start position of the second touch detection lead wire; the second straight line is parallel to an edge of the display region close to the bonding region; the second peripheral detection lead wire and the fourth peripheral detection lead wire are connected to different touch electrodes of a same touch unit; and the second touch detection lead wire is located on a side of the fourth peripheral detection lead wire close to the display region.

11. The display panel according to claim 7, wherein a width of at least a part of the third peripheral detection lead wire is equal to or less than a width of the touch detection lead wire, and a width of at least a part of the fourth peripheral detection lead wire is equal to or less than a width of the touch detection lead wire.

12. The display panel according to claim 1, wherein the display panel comprises a bending line located in the display region, a part of the display panel located on the bending line close to the peripheral region is bendable, and the touch detection lead wire is at least partially located on a side of the bending line close to the peripheral region.

13. The display panel according to claim 1, wherein the display panel further comprises a bonding region located on a side of part of the peripheral region away from the display region, and the touch detection lead wire is located within a part of the peripheral region close to the display region.

14. The display panel according to claim 1, wherein a corner part of the display panel is provided with a rounded chamfer, two ends of the rounded chamfer are smoothly connected with a first edge line and a second edge line correspondingly, the first edge line extends along a first direction, the second edge line extends along a second direction, and the first direction intersects with the second direction; a non-zero distance is provided between the rounded chamfer and a first extension line of the first edge line, and a non-zero distance is provided between the rounded chamfer and a second extension line of the second edge line;

wherein a start position of the touch detection lead wire is located on a side of the rounded chamfer away from the second extension line, and an end position of the touch detection lead wire is located on a side of the rounded chamfer close to the second edge line.

15. The display panel according to claim 1, wherein a notch is provided on an edge of the touch detection electrode, and the touch detection lead wire is located on a side of the notch away from the peripheral region.

16. The display panel according to claim 1, wherein a via hole is provided on the touch detection electrode, an area of an orthographic projection of the via hole on the base substrate is greater than an area of an orthographic projection of a grid on the base substrate, and a width of the grid line of the touch detection electrode adjacent to the via hole is greater than or equal to a width of the grid line of rest part.

17. The display panel according to claim 1, wherein the touch detection electrode comprises:

more than one first touch unit, arranged in sequence along a first direction, wherein the first touch unit comprises more than one first touch electrode arranged along a second direction, a first connection part is connected between two adjacent first touch electrodes, and the first direction intersects with the second direction; and more than one second touch unit, arranged in sequence along the second direction, wherein the second touch unit comprises more than one second touch electrode arranged along the first direction, and a second connection part is connected between two adjacent second touch electrodes;

wherein, a via hole is provided on the touch detection electrode, an area of an orthographic projection of the via hole on the base substrate is greater than an area of an orthographic projection of a grid on the base substrate, the via hole penetrates through the first touch unit and the second touch unit, and the orthographic projection of the via hole on the base substrate does not overlap with an orthographic projection of the first connection part on the base substrate and an orthographic projection of the second connection part on the base substrate;

wherein a width of the grid line of the first connection part adjacent to the via hole is greater than or equal to a width of the grid line of rest part, and a width of the grid line of the second connection part adjacent to the via hole is greater than or equal to a width of the grid line of the rest part.

18. The display panel according to claim 17, wherein the touch detection electrode further comprises:

a first connection wire, arranged on an edge of the via hole and connected to one of the first touch electrode; and a second connection wire, arranged on an edge of the via hole and connected to one of the second touch electrode;

wherein a width of the first connection wire is greater than or equal to a width of the grid line of the first touch unit, and a width of the second connection wire is greater than or equal to a width of the grid line of the second touch unit.

19. The display panel according to claim 17, wherein the touch detection lead wire is located in a same conductive layer as the first touch electrode and the second touch electrode, or the touch detection lead wire is located in a different conductive layer from the first touch electrode and the second touch electrode.

20. A display device, comprising: a display panel, comprising a display region and a peripheral region arranged around the display region, wherein the display panel comprises:

a base substrate;

a grid-shaped conductive part, arranged on a side of the base substrate and located in the display region, wherein the grid-shaped conductive part comprises:

a touch detection electrode;

a touch detection lead wire, arranged on a side of the touch detection electrode close to the peripheral region, and at least partially located in the display region;

wherein a first gap is provided between an orthographic projection of the touch detection lead wire on the base substrate and an orthographic projection of the touch detection electrode on the base substrate, and an outline of the first gap comprises at least two first curves connected in sequence.

\* \* \* \* \*